United States Patent
Yau et al.

(10) Patent No.: US 7,166,407 B2
(45) Date of Patent: *Jan. 23, 2007

(54) IMAGING ELEMENT HAVING PROTECTIVE OVERCOAT LAYERS

(75) Inventors: Hwei-Ling Yau, Rochester, NY (US); John L. Pawlak, Rochester, NY (US); Douglas H. Axtell, Rochester, NY (US); James L. Johnston, Rochester, NY (US); Yongcai Wang, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 451 days.

This patent is subject to a terminal disclaimer.

(21) Appl. No.: 10/687,939

(22) Filed: Oct. 17, 2003

(65) Prior Publication Data

US 2005/0084783 A1   Apr. 21, 2005

(51) Int. Cl.
  *G03C 1/72*   (2006.01)
(52) U.S. Cl. .................................................. 430/138
(58) Field of Classification Search .............. None
  See application file for complete search history.

(56) References Cited

U.S. PATENT DOCUMENTS

| | | | |
|---|---|---|---|
| 4,399,209 A | 8/1983 | Sanders et al. | |
| 4,416,966 A | 11/1983 | Sandera et al. | |
| 4,440,846 A | 4/1984 | Sanders et al. | |
| 4,766,050 A | 8/1988 | Jerry | |
| 5,783,353 A | 7/1998 | Camillus et al. | |
| 6,030,740 A | 2/2000 | Polykarpov | |
| 6,080,520 A | 6/2000 | Polykarpov et al. | |
| 6,365,319 B1 | 4/2002 | Heath et al. | |
| 6,544,711 B1 | 4/2003 | Anderson et al. | |
| 2002/0031716 A1 | 3/2002 | Nagata et al. | |
| 2002/0045121 A1 | 4/2002 | Higuchi et al. | |

FOREIGN PATENT DOCUMENTS

JP   2003-066599 A   *   5/2003

* cited by examiner

*Primary Examiner*—John A. McPherson
(74) *Attorney, Agent, or Firm*—Sarah Roberts; Donna Suchy

(57) ABSTRACT

This invention relates to an imaging element comprising in order a support: a light sensitive image forming unit comprising microcapsules and a developer: an inner protective overcoat layer: and an outer protective overcoat layer.

17 Claims, No Drawings

IMAGING ELEMENT HAVING PROTECTIVE OVERCOAT LAYERS

FIELD OF THE INVENTION

This invention relates to a light sensitive and heat or pressure developable imaging element comprising a light sensitive image forming unit comprising heat or pressure sensitive microcapsules, said imaging element further comprising two protective overcoat layers.

BACKGROUND OF THE INVENTION

In recent years various dry-type image-imaging processes which utilize a color-forming component capable of generating visible images by coloration or discoloration reaction have been disclosed in the patent literature. These imaging processes do not use a liquid developing solution or the like and, therefore, do not generate wastes. Both light sensitive and heat developable and light sensitive and pressure developable processes have been discussed in great detail. Both processes utilize a photopolymerization composition to create a latent image by irradiating the imaging element with light through an image original or using a digital image file. The latent image is composed of domains exposed to light at different degrees (from unexposed to fully exposed areas). The fully exposed domains have the highest degree of hardening, and the unexposed domains have lowest degree of hardening. Under heat or pressure or both, a visible image is formed due to the difference in the mobility of the color-forming component, said mobility being controlled by the degree of hardening. For example, in the unexposed area the color-forming component can move freely to allow a color formation reaction, and in the fully exposed area the color-forming component cannot move, thereby inhibiting a color formation reaction.

Imaging systems employing microencapsulated radiation sensitive compositions have been disclosed in U.S. Pat. Nos. 4,399,209; 4,416,966; 4,440,846; 4,766,050; and 5,783,353. These imaging systems are characterized in that an imaging sheet including a layer of microcapsules containing a photohardenable composition in the internal phase is imagewise exposed to light. In the most typical embodiments, the photohardenable composition is a photopolymerization composition including a polyethylenically unsaturated compound and a photoinitiator. A color former is encapsulated with the photopolymerization composition. Exposure to light hardens the internal phase of the microcapsules. Following exposure, the imaging sheet is developed by subjecting it to a uniform rupturing force in the presence of a developer.

An image transfer system in which the developer material is coated on a separate substrate as a separate developer or copy sheet is disclosed in U.S. Pat. No. 4,399,209. A self-contained imaging system in which the encapsulated color former and the developer material are present in one layer or in two interactive layers is disclosed in U.S. Pat. No. 4,440,846. Self-contained imaging systems having an opaque support are disclosed in commonly assigned U.S. Pat. No. 6,080,520. A two-sided imaging material is disclosed in commonly assigned U.S. Pat. No. 6,030,740.

The imaging system is capable of providing a full color imaging material in which the microcapsules are in three sets containing cyan, magenta, and yellow color formers respectively sensitive to red, green, and blue light. For good color balance, the light sensitive microcapsules are sensitive (X max) at about 450 nm, 540 nm, and 650 nm, respectively. Such a system is useful with visible light sources in direct transmission of reflection imaging. It is further useful in making contact prints, projected prints of color photographic slides, or in digital printing. It is also useful in electronic imaging using lasers or pencil light sources of appropriate wavelengths. Because digital imaging systems do not require the use of visible light, sensitivity can be extended into the UV and IR to spread the absorption spectra of the photoinitiators and avoid cross talk.

U.S. Pat. No. 5,783,353 discloses a self-contained imaging system wherein the imaging layer is sealed between two supports to form an integral unit (laminated structure). The sealed format is advantageous in that it can reduce oxygen permeation and improve stability of the media. U.S. Pat. No. 6,365,319 discloses a self-contained imaging assembly which has an imaging layer containing developer and photohardenable microcapsules placed between two support members, wherein one support is transparent and one support is opaque, and comprises a metallic barrier layer, and exhibits a water vapor transmission rate of less than 0.77 $g/m^2/day$ (0.05 $g/100$ $in^2/day$). U.S. Pat. No. 6,544,711 B1 discloses a self-contained imaging system which has an imaging layer containing developer and photohardenable microcapsules placed between two support members, wherein at least one support is transparent and at least one support comprises a ceramic barrier layer and exhibits a water vapor transmission rate not more than about 0.47 $g/m^2/day$ (0.03 $g/100$ $in^2/day$). While the laminated structure has improved media stability and protection against damage, the clear over-laminate through which one views the image degrades image sharpness and resolution. In addition, the laminated structure adds complexity and cost to manufacture.

U.S. application 2002/045121 A1 discloses a self-contained photosensitive material which includes an imaging layer of photosensitive microcapsules and a developer on a support and a protective coating on the imaging layer. The protective coating comprises a water-soluble or water-dispersible resin and provides scratch resistance and water resistance to the imaging media. The protective coating may also include a cross-linking agent, UV absorbing compounds, and pigments. Such elements have a number of disadvantages: The element has inherently low surface gloss. It requires careful handling to avoid accidentally rupturing the photosensitive microcapsules prior to exposure. In addition, such an element is prone to scratches, pressure marks, and cinch marks during manufacturing winding, rewinding, and finishing operations.

SUMMARY OF THE INVENTION

This invention provides an imaging element comprising in order a support;
a light sensitive image forming unit comprising microcapsules and a developer;
an inner protective overcoat layer; and
an outer protective overcoat layer.

In one preferred embodiment of the invention the outer protective overcoat layer has a modulus greater than the modulus of the inner protective layer. In another preferred embodiment the imaging element is light sensitive and pressure developable.

The imaging element of the invention has improved resistance against scratches, pressure marks, and cinch marks without the need for a laminated layer. It also has improved water resistance. The protective overcoat layers protect the imaging elements from damage by ultraviolet rays and also provide cushioning for damage by handling.

DETAILED DESCRIPTION OF THE INVENTION

The imaging element of the invention comprises a support, a light sensitive imaging forming unit comprising microcapsules and a developer, an inner protective layer overlaying the image forming unit, i.e., on the opposite side of the image forming unit from the support. It further comprises an outer protective layer overlaying the inner protective layer. The outer protective overcoat layer preferably has a modulus greater than the modulus of the inner protective layer. The outermost protective layer protects the imaging element against scratches, pressure marks, cinch marks, and water resistance. The inner protective overcoat layer protects the imaging elements from damage by ultraviolet rays. The inner protective layer also acts as a cushioning layer to protect the image element from damage by handling. The two-layer format also provides significant gloss improvement over a single protective layer.

It is preferred that the outer protective overcoat layer has a modulus greater than the modulus of the inner protective layer, i.e., that the inner layer be softer than the outer layer. Preferably the outer protective overcoat layer has a Young's modulus ratio to the inner protective layer of greater than 1.2, more preferably greater 1.5. Preferably the inner protective overcoat layer has a Young's modulus of less than 3 Gpa and the outer protective overcoat layer has a Young's modulus greater than 3 Gpa. The thickness of the outer protective layer ranges from 0.1 to 6 µm, and preferably from 0.3 to 4 µm, and more preferably from 0.5 to 3 µm. The thickness of the inner protective layer is greater than 0.5 µm, and preferably greater than 1 µm. and more preferably from 2 to 15 µm. The ratio of inner protective layer thickness to the outer protective layer thickness is greater than 1.

The inner protective overcoat layer preferably comprises a hydrophilic colloid. The hydrophilic colloid useful for the present invention includes both synthetic and natural water soluble polymers. Preferably the hydrophilic polymers suitable for use in the present invention further comprise either a chemical moiety capable of capable of forming a covalent chemical bond with a cross-linker. Naturally occurring substances include proteins, protein derivatives, cellulose derivatives (e.g., cellulose esters), polysaccharides, casein, and the like, and synthetic water permeable colloids include poly(vinyl lactams), acrylamide polymers, poly(vinyl alcohol) and its derivatives, hydrolyzed polyvinyl acetates, polymers of alkyl and sulfoalkyl acrylates and methacrylates, polyamides, polyvinyl pyridine, acrylic acid polymers, maleic anhydride copolymers, polyalkylene oxide, methacrylamide copolymers, polyvinyl oxazolidinones, maleic acid copolymers, vinyl amine copolymers, methacrylic acid copolymers, acryloyloxyalkyl sulfonic acid copolymers, vinyl imidazole copolymers, vinyl sulfide copolymers, homopolymer or copolymers containing styrene sulfonic acid, and the like. Gelatin is the most preferred hydrophilic colloid for the present invention.

The inner protective overcoat layer may further comprise a water dispersible resin. Resins which can be used in the protective coating of the present invention include those having film-forming properties. When formed into a film by drying or curing, the resin should be essentially transparent and remain transparent over a broad temperature range without clouding or yellowing. The resin film should also impart scratch resistance, water resistance, gloss, and durability to the protective coating. Examples of water-dispersible resins include acrylic latex (e.g., acrylic ester, modified acrylic ester, acrylic ester copolymer, modified acrylic ester copolymer) and other polymer latices (e.g., styrene-butadiene copolymer, styrene-maleic anhydride copolymer, butadiene-methacrylate copolymer, vinylacetate-vinyl chloride-ethylene copolymer, vinylidene chloride-acrylonitrile copolymer, etc.). In one embodiment, the resin used in the protective coating is an acrylic latex. Examples of acrylic latices, include but are not limited to, acrylic esters, modified acrylic esters, acrylic ester co-polymers, and modified acrylic ester copolymers. In another embodiment of the invention, the resin used in the protective overcoat is a water dispersible polyurethane, or an acrylic-polyurethane hybrid.

The outer protective overcoat layer may comprise the same hydrophilic colloids and water dispersible resins as described above for the inner protective layer. Cross-linking agents may be incorporated into the inner and outer protective coating composition, depending on the types of polymer used, to ensure that the protective coating provides the desired properties, namely water resistance, scratch resistance, and gloss. Examples of preferred cross-linking agents used in the protective coating include, but are not limited to, polyvalent aldehyde compounds such as glyoxal, glutaraldehyde, and derivatives of those compounds which retain free aldehyde groups. Glyoxal is the preferred polyaldehyde. Other cross-linking agents useful in the present invention include di-isocyanate compounds, epoxy compounds, bis-ethyleneimine compounds, di-vinyl compounds (e.g., divinylbenzene), methacrylic (or acrylic) ester of polyhydric alcohol (e.g., TMPTA), allylglycidyl ether, di-epoxide of polyhydric alcohol, methacrylic anhydride, N-methylolacrylamide, organic peroxide, di-amine compounds, bis-2-oxazoline compounds, polymers having 2-oxazoline group and polymer having carbodiimide group. The cross-linking agent is typically present in an amount from about 2% to 20%, and preferably from about 4% to 10%, based on total solids content of the protective coating.

The inner protective layer and the outer protective layer may further include other additional components such as surfactants, UV absorbing compounds, light stabilizers, pigments, matting agents, fillers, etc. Inclusion of surfactants as wetting agents allows the aqueous coating solution to spread uniformly across the photosensitive layer's surface and produce a smooth coating. Generally, the amount of wetting agent in the coating solution should be from about 1% to about 10% by weight of the coating solution, more preferably from about 4% to about 8%. Examples of wetting agents include dialkyl sulfosuccinate sodium salt and anion fluoroalkyl type surfactants. These surfactants are commercially available from Kao Corp. (PELEX OTP) and Dainippon Ink Chemicals, Inc. (Megafac F140NK), respectively.

Preferably the UV absorbing compounds are in the inner protective layer. Such compounds improve the light resistance and stability of the image media. The types of ultraviolet ray absorbers which can be used for the practice of the present invention are not particularly limited, provided their absorption maximum wavelengths fall within the range of 300 to 400 nm, and they have no harmful effect on the imaging properties of the element. Such UV dyes include ultraviolet absorbers of the thiazolidone type, the benzotriazole type, the cinnamic acid ester type, the benzophenone type, and the aminobutadiene type and have been described in detail in, for example, U.S. Pat. Nos. 1,023,859; 2,685, 512; 2,739,888; 2,748,021; 3,004,896; 3,052,636; 3,215, 530; 3,253,921; 3,533,794; 3,692,525; 3,705,805; 3,707, 375; 3,738,837; and 3,754,919; and British Patent No 1,321, 355. Preferably the UV absorber is a benzotriazole compound and, in particular, a high molecular weight benzotriazole emulsion. A specific material this type is ULS-1383 MG available from Ipposha Oil. The amount of the ultraviolet absorbing compound is not limited specifically; it is desirable to adjust the amount preferably to 5% to 30% based on total solids content of the protective coating.

The outer protective layer may further comprise a hard filler that has a modulus greater than 10 Gpa. Representative hard fillers include colloidal silica, colloidal tin oxide, colloidal titanium dioxide, mica, clays, doped-metal oxides, metal oxides containing oxygen deficiencies, metal antimonates, conductive nitrides, carbides, or borides, for example, $TiO_2$, $SnO_2$, $Al_2O_3$, $ZrO_3$, $In_2O_2$, MgO, $ZnSb_2O_2$, $InSbO_2$, $TiB_2$, $ZrB_2$, $NbB_2$, $TaB_2$, $TaB_2$, $CrB_2$, MoB, WB, $LaB_6$, ZrN, TiN, TiC, and WC. Preferably, the hard filler has a refractive index less than or equal to 2.1, and most preferably less than or equal to 1.6. It is important to limit the refractive index of the filler in order to provide good transparency of the layer. Preferably the outer protective layer comprises greater than 10%, more preferably than 15% hard filler. It is important to limit the refractive index of the filler in order to provide good transparency of the layer. The filler also has a particle size less than or equal to 500 nm, and preferably, less than 100 nm.

The outer protective layer may further comprise a pigment to improve handling and to prevent blocking. The pigment is defined to have a particle size of greater than 0.5 μm. Examples of the pigment may include inorganic pigments such as calcium carbonate, zinc oxide, titanium dioxide, silicone dioxide, aluminum hydroxide, barium sulfate, zinc sulfate, talc, kaolin, clay and colloidal silica, and organic pigments such as styrene microballs, nylon powder, polyethylene powder, urea-formaldehyde resin filler, and raw starch particles.

The outer protective layer may further comprise a lubricant. Examples of lubricants include (1) silicone based materials disclosed, for example, in U.S. Pat. Nos. 3,489,567; 3,080,317; 3,042,522; 4,004,927; and 4,047,958: and in British Patent Nos. 955.061 and 1,143,118; (2) higher fatty acids and derivatives, higher alcohols and derivatives, metal salts of higher fatty acids, higher fatty acid esters, higher fatty acid amides, polyhydric alcohol esters of higher fatty acids, etc., disclosed in U.S. Pat. Nos. 2,454,043; 2,732,305; 2,976,148; 3,206,311; 3,933,516; 2,588,765; 3,121,060; 3,502,473; 3,042,222; and 4,427,964; in British Patent Nos. 1,263,722; 1,198,387; 1,430,997; 1,466,304; 1,320,757; 1,320,565; and 1,320,756; and in German Patent Nos. 1,284,295 and 1,284,294; (3) liquid paraffin and paraffin or wax like materials such as camauba wax, natural and synthetic waxes, petroleum waxes, mineral waxes, and the like; (4) perfluoro- or fluoro- or fluorochloro-containing materials, which include poly(tetrafluoroethlyene), poly(trifluorochloroethylene), poly(vinylidene fluoride, poly(trifluorochloroethylene-co-vinyl chloride), poly(meth)acrylates or poly(meth)acrylamides containing perfluoroalkyl side groups, and the like. Lubricants useful in the present invention are described in further detail in *Research Disclosure* No. 308, published December 1989, page 1006.

The imaging element of the invention may further comprise at least one non-imaging layer comprising a hydrophilic colloid located between the support and the imaging unit. Examples of suitable hydrophilic colloids include both synthetic and natural water soluble polymers. Preferably the hydrophilic polymers suitable for use in the present invention further comprise either a chemical moiety capable of capable of forming a covalent chemical bond with a cross-linker. Naturally occurring substances include proteins, protein derivatives, cellulose derivatives (e.g., cellulose esters), polysaccharides, casein, and the like, and synthetic water permeable colloids include poly(vinyl lactams), acrylamide polymers, poly(vinyl alcohol) and its derivatives, hydrolyzed polyvinyl acetates, polymers of alkyl and sulfoalkyl acrylates and methacrylates, polyamides, polyvinyl pyridine, acrylic acid polymers, maleic anhydride copolymers, polyalkylene oxide, methacrylamide copolymers, polyvinyl oxazolidinones, maleic acid copolymers, vinyl amine copolymers, methacrylic acid copolymers, acryloyloxyalkyl sulfonic acid copolymers, vinyl imidazole copolymers, vinyl sulfide copolymers, homopolymer or copolymers containing styrene sulfonic acid, and the like. Gelatin is the most preferred hydrophilic colloid for the present invention.

The non-imaging layer may further comprise a latex or a water dispersible resin. Resins which can be used in the non-imaging layer of the present invention include those having film-forming properties. When formed into a film by drying or curing, the resin should be essentially transparent and remain transparent over a broad temperature range without clouding or yellowing. Examples of water-dispersible resins include acrylic latex (e.g., acrylic ester, modified acrylic ester, acrylic ester copolymer, modified acrylic ester copolymer) and other polymer latices (e.g., styrene-butadiene copolymer, styrene-maleic anhydride copolymer, butadiene-methacrylate copolymer, vinylacetate-vinyl chloride-ethylene copolymer, vinylidene chloride-acrylonitrile copolymer, etc.). In one embodiment, the binder used in the non-imaging layer is an acrylic latex. Examples of acrylic latices, include but are not limited to, acrylic esters, modified acrylic esters, acrylic ester co-polymers, and modified acrylic ester copolymers. In another embodiment of the invention, the binder used in the non-imaging layer is a water dispersible polyurethane, or an acrylic-polyurethane hybrid. In one embodiment the non-imaging layer may comprise a cross-linker as described above for the protective layers.

If necessary, an antihalation layer may be provided on the surface of the support to be used. The imaging element may also comprise an antistatic layer, preferably on the back of the support. i.e., the opposite side of the support from the imaging unit. Further, a sliding layer, a curl-preventive layer, an adhesive layer, or the like may be provided on the back of the support to be used. Further, if necessary, an adhesive layer may be provided between a support and the light sensitive and heat developable or the light sensitive and pressure developable image forming unit such that the support is used as a peel paper to thereby provide an aspect having a seal.

When an antihalation layer is provided between a support and the light sensitive and heat developable or the light sensitive and pressure-developable image forming unit, or alternatively, on the support surface facing the side having image forming unit in the case of a transparent support, the antihalation layer may be one that can be bleached by irradiation with light or by the application of heat.

For the preparation of a layer that can be bleached by irradiation with light, for example, a combination of the organic dye and organic borate compound described previously can be used. For the preparation of a layer that can be bleached by heat, for example, a composition in which the heat generates a base or nucleophile capable of bleaching the organic dye that is present can be utilized.

The imaging element of the present invention can be prepared by a process comprising the steps of preparing a coating liquid for forming a light sensitive and heat developable or light sensitive and pressure developable image forming unit or the separate imaging layers, a coating liquid for forming protective layers or intermediate layer by, for example, dissolving the respective constituent components in solvents, applying the coating liquids successively onto a desired support, and drying the coating layers. Examples of the solvent that can be used for the preparation of the coating liquids include water; alcohols such as methanol, ethanol, n-propanol, isopropanol, n-butanol, sec-butanol, methyl cellosolve, and 1-methoxy-2-propanol; halogen-based solvents such as methylene chloride and ethylene chloride; ketones such as acetone, cyclohexanone, and ethyl ethyl ketone; esters such as methyl cellosolve acetate, ethyl acetate, and ethyl acetate; toluene; xylene: and a mixture of two or more thereof. Among these solvents, water is particularly preferable.

When applying the coating liquid for forming an image forming unit or imaging layer onto the support, a blade coater, a rod coater, a knife coater, a roll-doctor coater, a reverse roll coater, a transfer roll coater, a gravure coater, a kiss roll coater, a curtain coater, an extrusion coater, etc., can be used. The application can be carried out using the coating method described in *Research Disclosure*, Vol. 200 (December 1980, Item 20036 XV). The thickness of the image forming unit is preferably in the range of 0.1 to 50 µm, more preferably in the range of 5 to 35 µm, and most preferably in the range of 10 to 30 µm.

Preferably the imaging element is manufactured by the following method:
a) taking a support;
b) simultaneously coating on said support a first chill settable layer and a non-chill settable layer;
c) lowering the temperature of the layers to immobilize said layers; and
d) drying said layers.

The non-chill settable layer corresponds to the image forming unit of the light sensitive and heat and pressure developable imaging element and the first chill settable layer corresponds to the protective layers. The sub-layers (if present) of the non-chill settable layer correspond to the differing layers of the image forming unit. The first chill settable layer may have an outer sub-layer and an inner sub-layer which correspond to the inner and outer protective layers.

The preferred method of applying or coating the layers on the support can be summarized by the definition put forth by Gutoff et al where coating is described as "multiple streams exiting onto an inclined plane without mixing, across a gap and onto a moving web. The streams remain separate and distinct from the moment they emerge onto the slide, cross the gap, get coated onto the web and in the final dried coating". (Gutoff, Edgar B., Cohen Edward D. (1995). *Coating and Drying Defects Troubleshooting Operating Problems*, John Wiley and Sons p. 101). Simultaneous multilayer coating processes are also described in U.S. Pat. No. 2,716,419 (the method employing a multilayer slide bead coating process) and U.S. Pat. No. 3,508,947 (the method of a multilayer slide curtain coating process). Preferably the web (support) is transported to the coating point where the layers are simultaneously applied across the gap. Preferably a multi-slotted slide hopper is used in the method of the invention.

The protective layers (chill settable layers) are preferably made up of materials such that when the temperature of the coated solution is lowered, the viscosity of the material increases or the material forms a linkage or network of transitional solids such that when the layer undergoes the drying process, the air flow or air temperatures used in drying do not cause any variation in coating thickness or gross imperfection to be seen. The most commonly used chill settable material is gelatin, however, the composition of the chill settable layer may include, but is not exclusive to gelatin. Agar, a polysaccharide from seaweed is another example of a chill settable material. The temperature at which chill setting occurs depends on the type of gelatin, the gelatin concentration, pH, ionic strength of the coating solution and other components in the solution. It also depends on various other factors, such as time. The typical temperature is below 30° C. and above 0° C.

The image forming unit (non-chill settable layer) preferably is a layer wherein the composition is such that by solely lowering the temperature of the layer, without the presence of any other components or layer parts, the viscosity of the layer is not increased significantly enough to allow this layer to pass through the drying process without causing variation in the coating thickness or gross imperfections. Such a layer will not be immobilized until it actually freezes or dries. However, freezing a coating layer not only requires more energy, but also generates a different type of imperfection from the formation of crystal structure of water. Examples of non-chill settable materials include aqueous dispersible polymers such as latex, polyurethane or polyester, inorganic oxide dispersions, aqueous solutions containing polymers such as cellulose derivatives (e.g. cellulose esters), polysaccharides, casein, and the like, and synthetic water permeable colloids include poly(vinyl lactams), acrylamide polymers, poly(vinyl alcohol) and its derivatives, hydrolyzed polyvinyl acetates, polymers of alkyl and sulfoalkyl acrylates and methacrylates, polyamides, polyvinyl pyridine, acrylic acid polymers, maleic anhydride copolymers, polyalkylene oxide, methacrylamide copolymers, polyvinyl oxazolidinones, maleic acid copolymers, vinyl amine copolymers, methacrylic acid copolymers, acryloyloxyalkyl sulfonic acid copolymers, vinyl imidazole copolymers, vinyl sulfide copolymers, homopolymer or copolymers containing styrene sulfonic acid. Solutions that do not contain chill settable materials, such as gelatin, Agar, etc., usually are non-chill settable.

Once the first chill settable and non-chill settable layers are applied, they undergo a chilling process wherein the temperature of the coating is lowered below the coating temperature. In this process the coating is passed through conditions that can be as high as 30° C., and as low as 0° C. Preferably the temperature is less than 20° C. and more preferably less than 10° C. After the coating is applied and goes through the chill setting process it is then dried in a manner that will not disturb the layer thickness or uniformity as the solvent is removed, such as by forced air drying. The temperature at which the coating is dried should not exceed 50° C.

In the coating application process it is desirable to provide a method to allow the movement of water between the non-chill setting layers and the setting layers, as well as the substrate. This diffusion of water assists in the immobilization process. In one preferred embodiment either the support absorbs water, or an additional layer which absorbs water may be coated on the support. The water absorbing layer, if present, is between the support and the non-chill settable layer, and generally is directly adjacent to the support. The water absorbing layer may be chill settable. Preferably this layer is a gelatin layer. This layer corresponds to the non-imaging layer described below for the light sensitive and heat or pressure developable imaging element. The water absorbing layer is generally applied separately and then dried prior to coating the chill settable and non-chill settable layers. It is possible to coat the water absorbing layer simultaneously with the chill settable and non-chill settable layers.

The imaging element of the present invention comprises a support and an image forming unit above the support. It may be a light sensitive and heat developable type imaging element comprising a support having at least one light sensitive and heat developable image forming unit provided thereon: or a light sensitive and pressure developable type imaging element comprising a support having at least one light sensitive and pressure developable image forming unit provided thereon. Examples of these imaging elements include the following imaging element types (a), (b), and (c).

Element type (a) is a light sensitive and heat-developable imaging element comprising a support having a light sensitive and heat developable image forming unit provided thereon which contains heat-responsive microcapsules enclosing a color-forming component A. Outside the microcapsules is a photopolymerization composition comprising at least a substantially colorless compound B (polymerizable developer) having in the molecule thereof a polymerizable group and a site which reacts with the color-forming component A to develop a color, and a photopolymerization initiator. In the light sensitive and heat developable imaging element (a), exposure to light according to a desired image causes the photopolymerization composition (compound B) present outside the microcapsules to harden by a polymerization reaction due to the radical generated from the photopolymerization initiator so that a latent image in a desired shape is formed. Next, when the imaging element is heated, the compound B present in unexposed portions which has not polymerized moves within the imaging element and reacts with the color-forming component A inside the microcapsules to develop a color. Accordingly, the light sensitive and heat developable image-imaging element (a) is a positive-type, light sensitive, and heat developable imaging element in which the image formation is performed such that color formation does not take place in exposed portions but takes place in the unexposed portions that do not harden.

Element type (b) is a light sensitive and heat-developable imaging element comprising a support having a light sensitive and heat developable image forming unit provided thereon which includes heat-responsive microcapsules enclosing a color-forming component A. Outside the microcapsules is a photopolymerization composition comprising at least a substantially colorless compound C (developer) which reacts with the color-forming component A to develop a color, a substantially colorless compound D (polymerizable compound) having in the molecule thereof a polymerizable group, and a photopolymerization initiator. In the light sensitive and heat developable imaging element (b) exposure to light according to a desired image causes the compound D having a polymerizable group to harden by a polymerization reaction due to the radical generated from the photopolymerization initiator so that a latent image is formed in a desired shape. Next, depending on the film property of the latent image (i.e., hardened portion), when the element is heated, the compound C moves and reacts with the color-forming component A inside the microcapsules to form an image.

Element type (c) is a light sensitive and pressure-developable imaging element comprising a support having a light sensitive and pressure developable image forming unit provided thereon which includes light and pressure-response microcapsules enclosing a color-forming component A, a polymerizable compound, and a photopolymerization initiator. Outside the microcapsules is a substantially colorless compound E (developer) designed to react with the color-forming component A to develop a color. In the light sensitive and pressure developable imaging element (c), exposure to light according to a desired image causes the polymerizable compound present inside the microcapsules to harden the microcapsule interior by a polymerization reaction due to the radical generated from the photopolymerization initiator upon exposure so that a latent image in a desired shape is formed. That is, in the exposed portions, the color-forming reaction with the compound E present outside the microcapsules is inhibited. Next, when pressure is applied to the imaging element, the microcapsules which have not hardened (the unexposed microcapsules) are broken and the compound E present in the unexposed portions moves within the imaging element and reacts with the color-forming component A present inside the microcapsules to develop a color. Accordingly, the light sensitive and pressure developable image-imaging element (c) is a positive-type, light sensitive, and pressure developable imaging element in which the image formation is preformed such that color formation is not made in exposed portions but color formation is made in the unexposed portions that do not harden.

The imaging element described above comprises a support having a light sensitive and heat developable image forming unit or a light sensitive and pressure developable image forming unit provided thereon. In a preferred embodiment the element comprises an image forming unit which is light sensitive and pressure developable. i.e., it is exposed by light and developed by applying pressure and selectively rupturing the microcapsules. The image forming unit of the various element types may comprise one layer or more than one layer. The microcapsules and the developer may be in the same layer or in different layers. Preferably they are in the same layer. Microcapsules which are sensitive to different wavelengths of the spectrum may be in the same layer or in different layers. Preferably they are in the same layer.

The color-forming component A useful for the practice of the invention include an electron-donating, colorless dye such that the dye reacts with a developer (i.e., compound B. compound C, or compound E) to develop a color. Specific examples of these color-forming components include those described in Chemistry and Applications of Leuco Dye, Edited by Ramaiah Muthyala, Plenum Publishing Corporation, 1997. Representative examples of such color formers include substantially colorless compounds having in their partial skeleton a lactone, a lactam, a sultone, a spiropyran, an ester, or an amido structure. More specifically, examples include triarylmethane compounds, bisphenylmethane compounds, xanthene compounds, thiazine compounds, and spiropyran compounds. Typical examples of the color formers include Crystal Violet lactone, benzoyl leuco methylene blue, Malachite Green Lactone, p-nitrobenzoyl leuco methylene blue. 3-dialkylamino-7-dialkylamino-fluoran, 3-methyl-2,2'-spirobi(benzo-f-chrome), 3,3-bis(p-dimethylaminophenyl)phthalide, 3-(p-dimethylaminophenyl)-3-(1,2 dimethylindole-3-yl)phthalide, 3-(p-dimethylaminophenyl)-3-(2-methylindole-3-yl)phthalide, 3-(p-dimethylaminophenyl)-3-(2-phenylindole-3-yl)phthalide, 3,3-bis(1,2-dimethylindole-3-yl)-5-dimethylaminophthalide, 3,3-bis-(1,2-dimethylindole-3-yl)6-dimethylaminophthalide. 3,3-bis-(9-ethylcarbazole-3-yl)-5-dimethylaininophthalide, 3,3-bix(2-phenylindole-3-yl)-5-dimethylaminophthalide, 3-p-dimethylaminophenyl-3-(1-methyl pyrrole-2-yl)-6-dimethylaminophthalide, 4,4'-bis-dimethylaininobenizhydrin benzyl ether, N-halophenyl leuco Auramine, N-2,4,5-trichlorophenyl leuco Auramine, Rhodamine-B-anilinolactain, Thodamine-(p-nitroanilino) lactam. Rhodamine-B-(p-chloroanilino)lactam, 3-dimethylamino-6-methoxyfluoran, 3-diethylamino-7-methoxyfluoran, 3-diethylamino-7-chloro-6-methlylfluoroan, 3-diethylamino-6-methyl-7-anilinofluoran, 3-diethylamino-7-(acetylmethylamino)fluoran, 3-diethylamino-7-(dibenzylamino)fluoran, 3-diethylamino-7-(methylbenzylamino)fluoran, 3-diethylamino-7-(chloroethylmethylamino)fluoran, 3-diethylamino-7-(diethylamino)tluoran, 3-methyl-spiro-dinaphthopyran, 3,3'-dichloro-spiro-dinaphthopyran, 3-benzyl-spiro-dinaphthopyran, 3-methyl-naphtho-(3-methoxybenzo)-spiropyran, 3-propyl-spirodibenzoidipyran, etc. Mixtures of these color precursors can be used if desired. Also useful in the present invention are the fluoran color formers disclosed in U.S. Pat. No. 3,920,510, which is incorporated by reference. In addition to the foregoing dye precursors, fluoran compounds such as disclosed in U.S. Pat. No. 3,920,510 can be used. In addition, organic compounds capable of reacting with heavy metal salts to give colored metal complexes, chelates, or salts can be adapted for use in the present invention.

The substantially colorless compound B (polymerizable developer) has in the molecule a polymerizable group and a site that reacts with the color-forming component A to develop a color. The substantially colorless compound B may be any compound, such as electron-accepting compound having a polymerizable group, or a coupler compound having a polymerizable group, which has the two functions, i.e., developing a color by reacting with the color-forming component A and hardening by photopolymerization.

The substantially colorless compound C (developer), which has no polymerizable group and reacts with the color-forming component A to develop a color, can also be used. Since compound C has no polymerizable group and it is necessary to impart a function of hardening the film by photopolymerization to the image forming layer, it needs to be used together with the photopolyinerizaton composition comprising a compound D having a polymerizable group. The compound C can be any electron-accepting compound having no polymerizable group and that develops a color by reacting with the color-forming components A. Examples of compound C are clay minerals such as acid clay, active clay, attapulgite. etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.: metal salts of aromatic carboxylic acids or derivatives thereof such as zinc salicylate, tin salicylate, zinc 2-hydroxy naphthoate, zinc 3,5 di-tert butyl salicylate, zinc 3,5-di-(a-methylbenzyl) salicylate, oil soluble metals salts or phenol-formaldehyde novolak resins (e.g., see U.S. Pat. Nos. 3,672,935 and 3,732,120) such as zinc modified oil soluble phenol-formaldehyde resin as disclosed in U.S. Pat. No. 3,732,120, zinc carbonate, etc., and mixtures thereof.

Compound D, having at least one polymerizable group, is an addition polymerizable compound selected from among the compounds having at least one, preferably two or more, ethylenically unsaturated bond at terminals. Such compounds are well known in the industry, and they can be used in the present invention with no particular limitation. Such compounds have, for example, the chemical form of a monomer, a prepolymer, i.e., a dimer, a trimer, and an oligomer or a mixture and a copolymer of them. As examples of monomers and copolymers thereof, unsaturated carboxylic acids (e.g., acrylic acid, methacrylic acid, itaconic acid; crotonic acid, isocrotonic acid, maleic acid, etc.), and esters and amides thereof can be exemplified, and preferably esters of unsaturated carboxylic acids and aliphatic polyhydric alcohol compounds, and amides of unsaturated carboxylic acids and aliphatic polyhydric amine compounds are used. In addition, the addition reaction products of unsaturated carboxylic esters and amides having a nucleophilic substituent such as a hydroxyl group, an amino group and a mercapto group with monofunctional or polyfunctional isocyanates and epoxies, and the dehydration condensation reaction products of these compounds with monofunctional or polyfunctional carboxylic acids are also preferably used. The addition reaction products of unsaturated carboxylic esters and amides having electrophilic substituents such as an isocyanato group and an epoxy group with monofunctional or polyfunctional alcohols, amines and thiols, and the substitution reaction products of unsaturated carboxylic esters and amides having releasable substituents such as a halogen group and a tosyloxy group with monofunctional or polyfunctional alcohols, amines and thiols are also preferably used. As another example, it is also possible to use compounds replaced with unsaturated phosphonic acid, styrene, vinyl ethel, etc., in place of the above-unsaturated carboxylic acids.

Specific examples of ester monomers of aliphatic polyhydric alcohol compounds and unsaturated carboxylic acids include, as acrylates, ethylene glycol diacrylate, triethylene glycol diacrylate, 1,3-butanediol diacrylate, tetrainethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer, etc. As methacrylates, examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexainethacrylate, sorbitol trimethacrylate, sorbitol tetramethacrylate, and bis[p-(3-methacryloxy-2-hydroxy-propoxy)phenyl]dimethylmethane, bis[p-(methacryloxy-ethoxy)-phenyl]dimethylmethane. As itaconates, examples include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate. As crotonates, examples include ethylene glycol dicrotonate, tetramethylene glycol dicrotonate, pentaerythritol dicrotonate, and sorbitol tetradicrotonate. As isocrotonates, examples include ethylene glycol diisocrotonate, pentaerythritol diisocrotonate, and sorbitol tetraisocrotonate. As maleates, examples include ethylene glycol dimaleate, triethylene glycol dimaleate, pentaerythritol dimaleate, and sorbitol tetramaleate. Further, the mixtures of the above-described ester monomers can also be used. Further, specific examples of amide monomers of aliphatic polyhydric amine compounds and unsaturated carboxylic acids include methylenebis-acrylamide, methylenebis-methacrylamide, 1,6-hexamethylenebis-acrylamide.

1,6-hexamethylenebis-methacrylamide, diethylenetriaminetris-acrylamide, xylylenebis-acrylamide, and xylylenebis-methacrylamide.

Further, urethane-based addition polymerizable compounds which are obtained by the addition reaction of an isocyanate and a hydroxyl group are also preferably used in the present invention. A specific example is a vinyl urethane compound having two or more polymerizable vinyl groups in one molecule, which is obtained by the addition of a vinyl monomer having a hydroxyl group represented by the following formula (V) to a polyisocyanate compound having two or more isocyanate groups in one molecule:

wherein R and R' each represents H or $CH_3$.

Other examples include polyfunctional acrylates and methacrylates, such as polyester acrylates, and epoxy acrylates obtained by reacting epoxy resins with (meth)acrylic acids. Moreover, photo-curable monomers and oligomers listed in Sartomer Product Catalog by Sartomer Company, Inc. (1999) can be used as well.

The details in usage of the addition polymerizable compound, e.g., what structure is to be used, whether the compound is to be used alone or in combination, or what an amount is to be used, can be optionally set up according to the final design of the characteristics of the photosensitive material. For example, the conditions are selected from the following viewpoint. For the photosensitive speed, a structure containing many unsaturated groups per molecule is preferred and in many cases bifunctional or more functional groups are preferred. For increasing the strength of an image part, i.e., a cured film, trifunctional, or more functional groups are preferred. It is effective to use different functional numbers and different polymerizable groups (e.g., acrylate, methacrylate, styrene compounds, vinyl ether compounds) in combination to control both photosensitivity and strength. Compounds having a large molecular weight or compounds having high hydrophobicity are excellent in photosensitive speed and film strength, but may not be preferred from the point of development speed and precipitation in a developing solution. The selection and usage of the addition polymerizable compound are important factors for compatibility with other components (e.g., a binder polymer, an initiator, a colorant, etc.) in the photopolymerization composition and for dispersibility. For example, sometimes compatibility can be improved by using a low purity compound or two or more compounds in combination. Further, it is also possible to select a compound having specific structure for the purpose of improving the adhesion property of a support and an overcoat layer. Concerning the compounding ratio of the addition polymerizable compound in a photopolymerization composition, the higher the amount, the higher the sensitivity. But, too large an amount sometimes results in disadvantageous phase separation, problems in the manufacturing process due to the stickiness of the photopolymerization composition (e.g., manufacturing failure resulting from the transfer and adhesion of the photosensitive material components), and precipitation from a developing solution. The addition polymerizable compound may be used alone or in combination of two or more. In addition, appropriate structure, compounding ratio and addition amount of the addition polymerizable compound can be arbitrarily selected taking into consideration the degree of polymerization hindrance due to oxygen, resolving power, fogging characteristic, refractive index variation, and surface adhesion. Further, the layer constitution and the coating method of undercoating and overcoating can be performed according to circumstances.

Various photoinitiators can be selected for use in the above-described imaging systems. However, by far, the most useful photoinitators consist of an organic dye and an organic borate salt such as disclosed in U.S. Pat. Nos. 5,112,752; 5,100,755; 5,057,393; 4,865,942; 4,842,980; 4,800,149; 4,772,530; and 4,772,541. The photoinitiator is preferably used in combination with a disulfide coinitiator as described in U.S. Pat. No. 5,230,982 and an autoxidizer which is capable of consuming oxygen in a free radical chain process.

The amount of organic dye to be used is preferably in the range of from 0.1 to 5% by weight based on the total weight of the photopolymerization composition, preferably from 0.2 to 3% by weight. The amount of borate compound contained in the photopolymerization composition of the invention is preferably from 0.1% to 20% by weight based on the total amount of photopolymerization composition, more preferably from 0.3 to 5% by weight, and most preferably from 0.3% to 2% by weight.

The ratio between the organic dye and organoborate salt is important from the standpoint of obtaining high sensitivity and sufficient decolorization by the irradiation of light in the fixing step of the recording process described later. The weight ratio of the organic dye to the organoborate salt is preferably in the range of from 2/1 to 1/50, more preferably less than 1/1 to 1/20, most preferably from 1/1 to 1/10.

The organic dyes for use in the present invention may be suitably selected from conventionally known compounds having a maximum absorption wavelength falling within a range of 300 to 1000 nm. High sensitivity can be achieved by selecting a desired dye having the wavelength range within described above and adjusting the sensitive wavelength to match the light source to be used. Also, it is possible to suitably select a light source such as blue, green, or red, or infrared LED (light emitting diode), solid state laser, OLED (organic light emitting diode) or laser, or the like for use in image-wise exposure to light.

Specific examples of the organic dyes include 3-ketocoumarin compounds, thiopyrylium salts, naphthothiazole-merocyanine compounds, merocyanine compounds, and merocyanine dyes containing thiobarbituric acid, hemioxanole dyes, and cyanine, hemicyanine, and merocyanine dyes having indolenine nuclei. Other examples of the organic dyes include the dyes described in Chemistry of Functional Dyes (1981, CMC Publishing Co., Ltd., pp. 393–416) and Coloring Materials (60[4], (previously presented). 212–224, 1987). Specific examples of these organic dyes include cationic methine dyes, cationic carbonium dyes, cationic quinoimine dyes, cationic indoline dyes, and cationic styryl dyes. Examples of the above-mentioned dyes include keto dyes such as coumarin dyes (including keto-coumarin and sulfonocoumarin), merostyryl dyes, oxonol dyes, and hemioxonol dyes; nonketo dyes such as nonketopolymethine dyes, triarylmethane dyes, xanthene dyes, anthracene dyes, rhodamine dyes, acridine dyes, aniline dyes, and azo dyes; nonketopolymethine dyes such as azomethine dyes, cyanine dyes, carbocyanine dyes, dicarbocyanine dyes, tricarbocyanine dyes, hemicyanine dyes, and styryl dyes; quinoneimine dyes such as azine dyes, oxazine dyes, thiazine dyes, quinoline dyes, and thiazole dyes.

Preferably the organic dye useful for the invention is a cationic (dye-borate anion complex formed from a cationic dye and an anionic organic borate. The cationic dye absorbs light having a maximum absorption wavelength falling within a range from 300 to 1000 nm, and the anionic borate has four R groups, of which three R groups each represents an aryl group which may have a substitute, and one R group is an alkyl group, or a substituted alkyl group. Such cationic dye-borate anion complexes have been disclosed in U.S. Pat. Nos. 5,112,752; 5,100,755; 5,075,393; 4,865,942; 4,842,980; 4,800,149; 4,772,530; and 4,772,541 which are incorporated herein by reference.

When the cationic dye-borate anion complex is used as the organic dye in the photopolymerization compositions of the invention, it does not require to use the organoborate salt. However, to increase the photopolymerization sensitivity and to reduce the cationic dye stain, it is preferred to use an organoborate salt in combination with the cationic dye-borate complex. The organic dye can be used singly or in combination.

Specific examples of the above-mentioned water insoluble phenols are given below. However, it should be noted that the present invention is not limited to these examples.

Dye-1

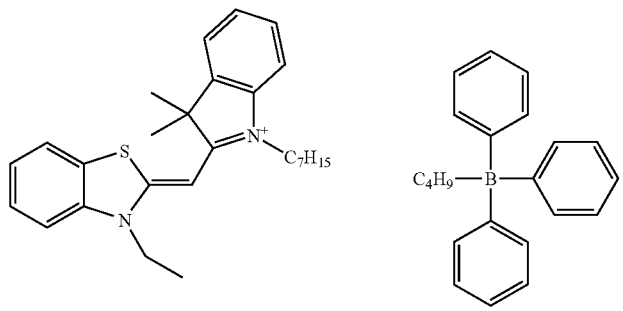

Dye-2

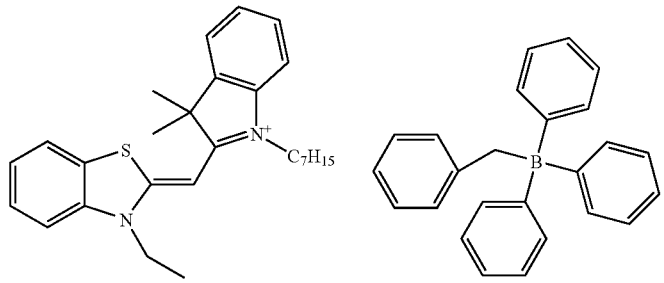

Dye-3

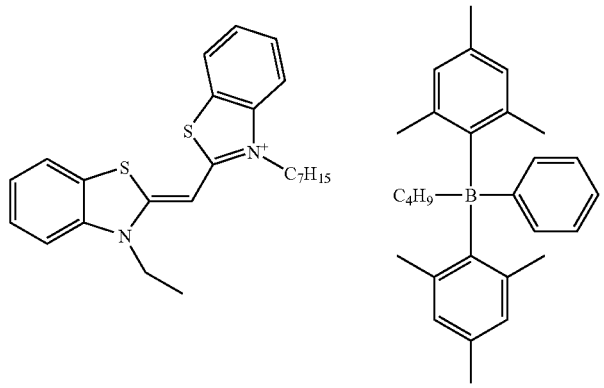

Dye-4

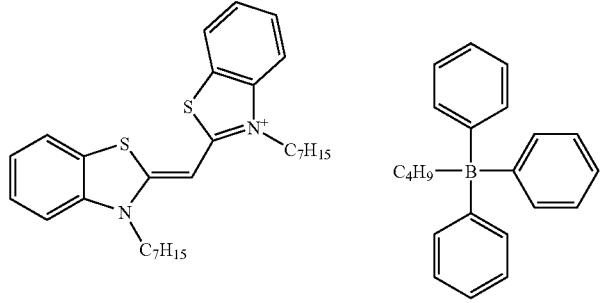

-continued
Dye-5
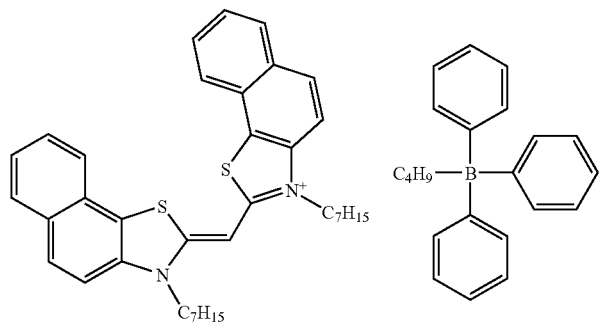
Dye-6
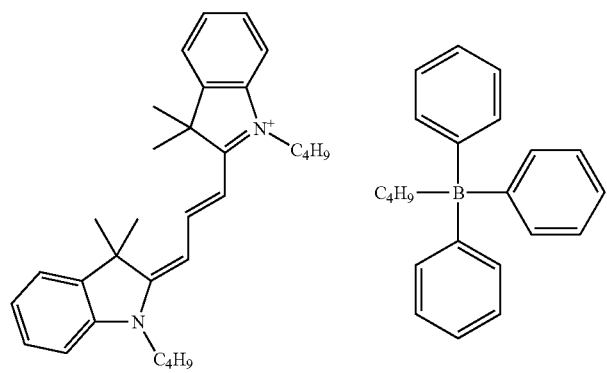
Dye-7
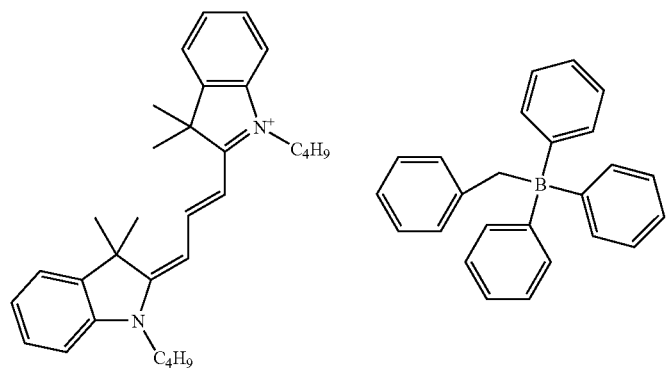
Dye-8
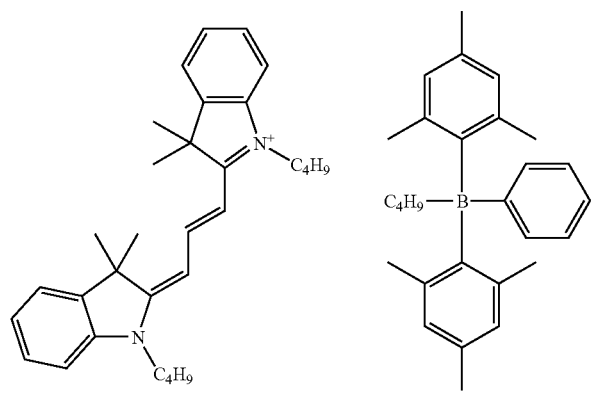

-continued
Dye-9
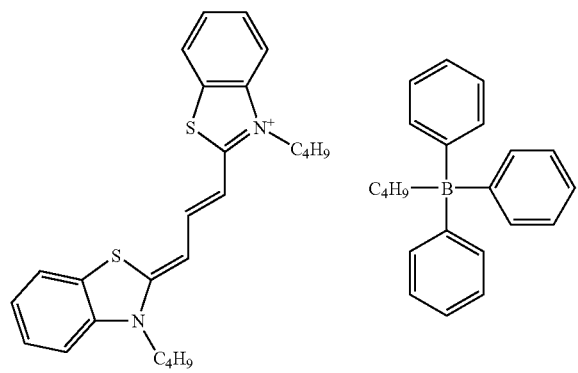
Dye-10
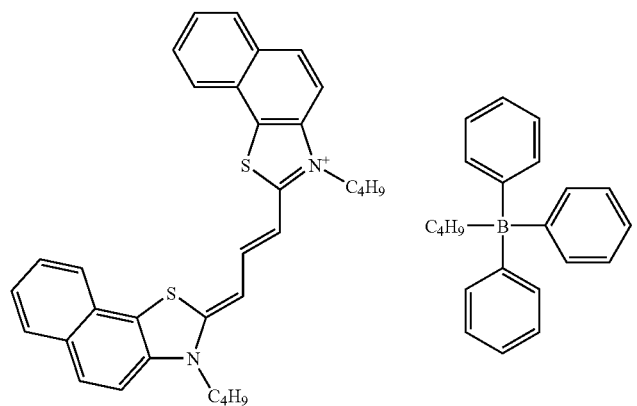
Dye-11
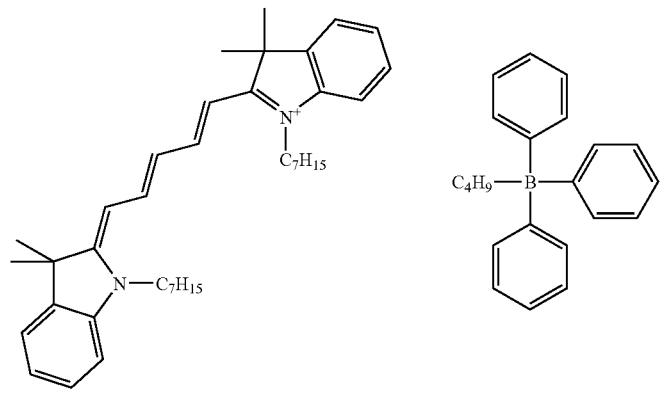
Dye-12
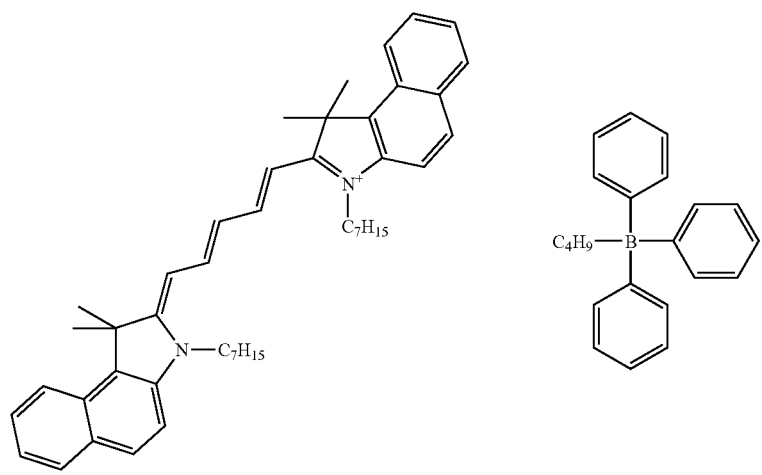

-continued
Dye-13
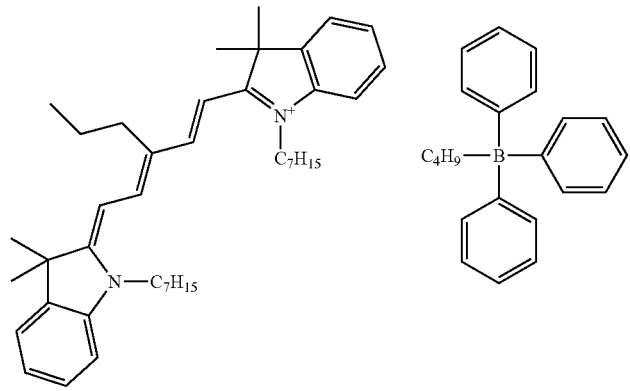
Dye-14
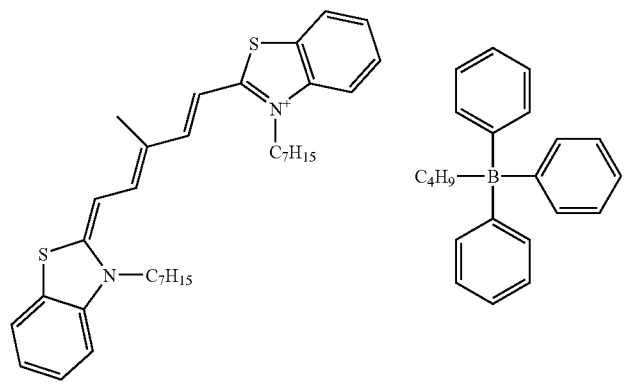
Dye-15
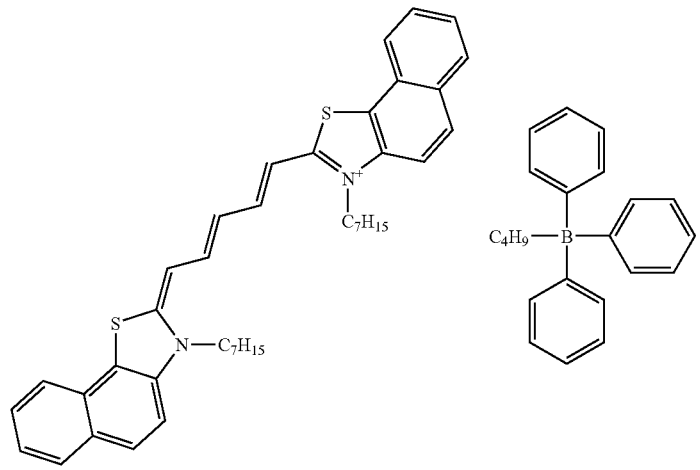
Dye-16
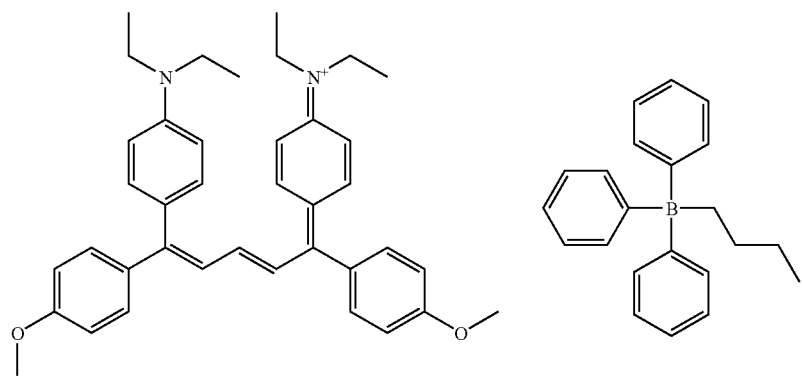

-continued

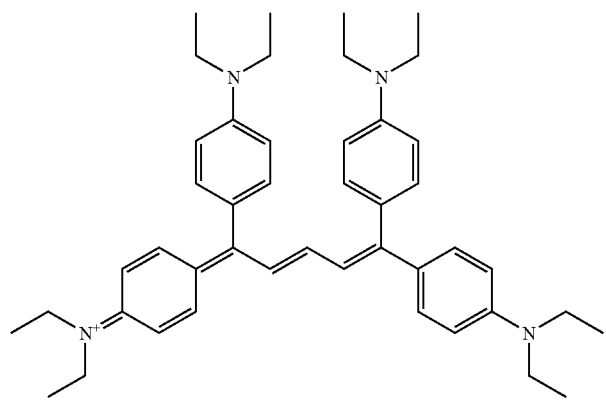

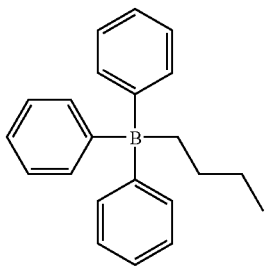

Dye-17

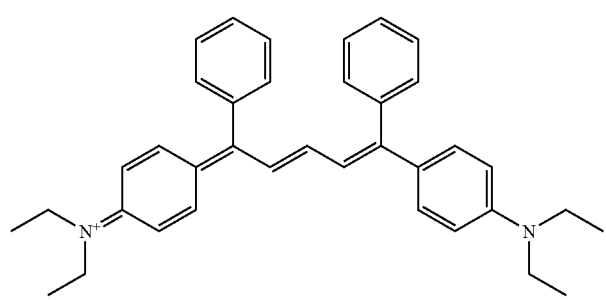

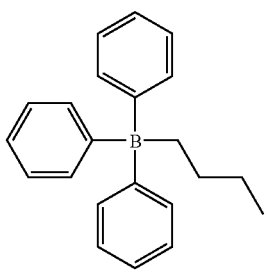

Dye-18

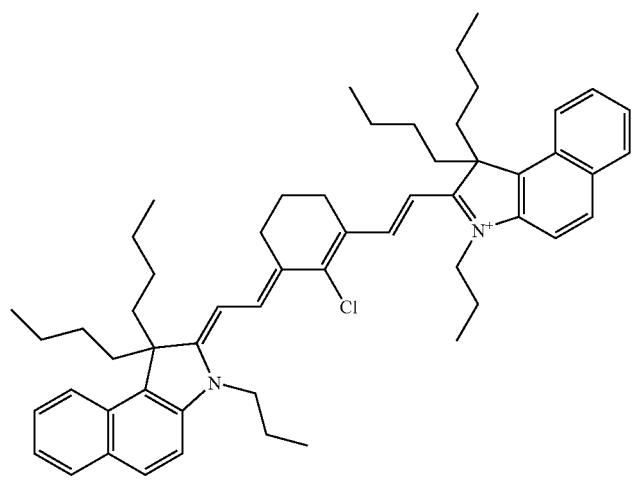

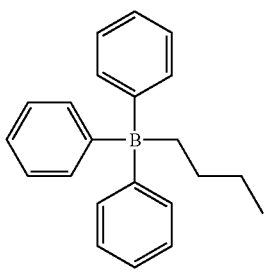

Dye-19

The borate salt useful for the photosensitive composition of the present invention is represented by the following general formula (I).

[BR$_4$]⁻Z⁺  [I]

where Z represents a group capable of forming cation and is not light sensitive, and [BR$_4$]⁻ is a borate compound having tour R groups which are selected from an alkyl group, a substituted alkyl group, an aryl group, a substituted aryl group, an aralkyl group, a substituted aralkyl group, an alkaryl group, a substituted alkaryl group, an alkenyl group, a substituted alkenyl group, an alkynyl group, a substituted alkynyl group, an alicyclic group, a substituted alicyclic group, a heterocyclic group, a substituted heterocyclic group, and a derivative thereof. Plural R's may be the same as or different from each other. In addition, two or more of these groups may join together directly or via a substituent and form a boron-containing heterocycle. Z⁺ does not absorb light and represents an alkali metal, quaternary ammonium, pyridinium, quinolinium, diazonium, morpholinium, tetrazolium, acridinium, phosphonium, sulfonium, oxosulfonium, iodonium, S, P, Cu, Ag, Hg, Pd, Fe, Co, Sn, Mo, Cr, Ni, As, or Se.

Specific examples of the above-mentioned borate salts are given below. However, it should be noted that the present invention is not limited to these examples.

BS-1
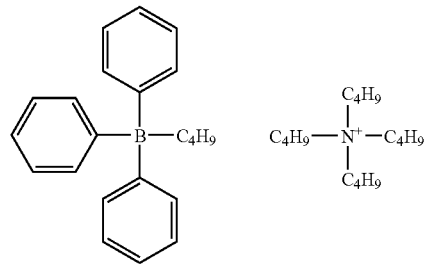 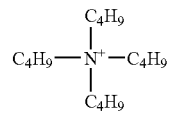
BS-2
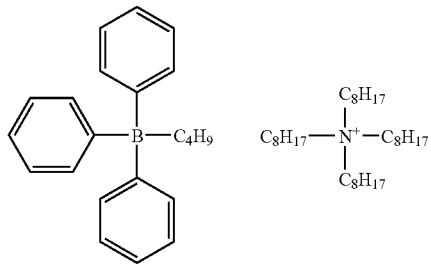 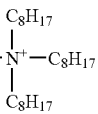
BS-3
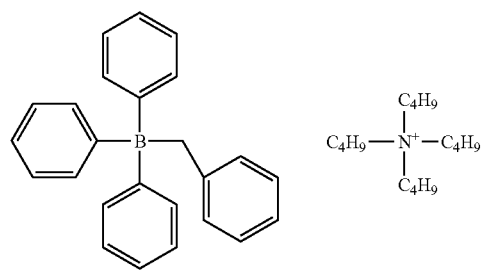 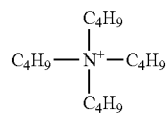
BS-4
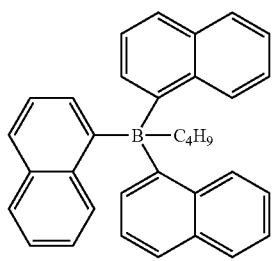 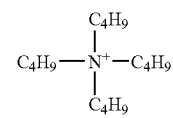
BS-5
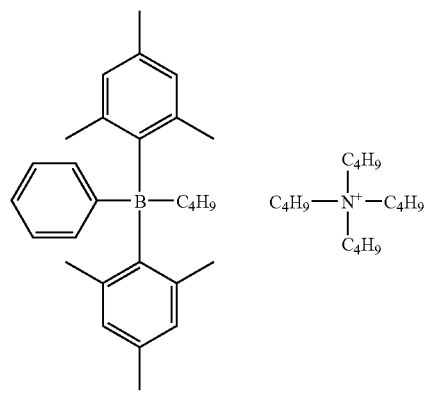 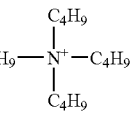
BS-6
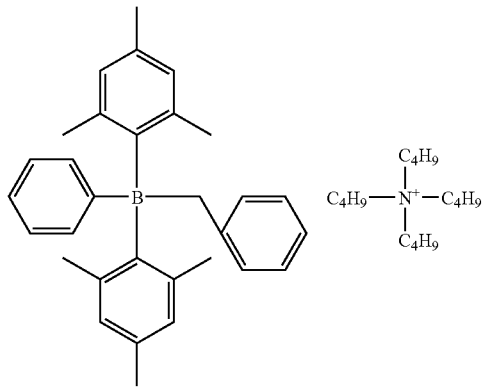 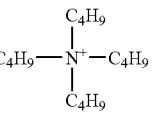
BS-7
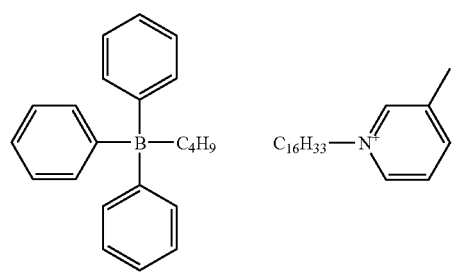 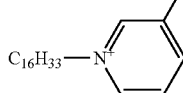
BS-8
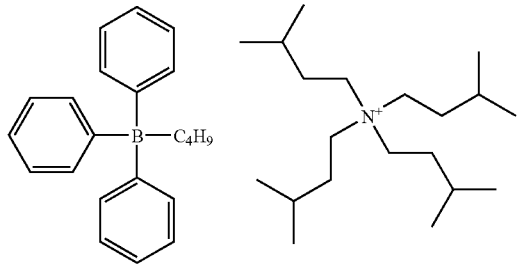
BS-9
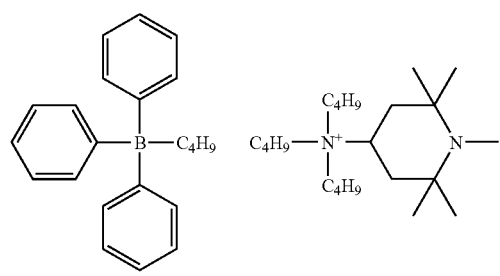 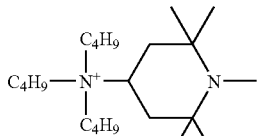
BS-10
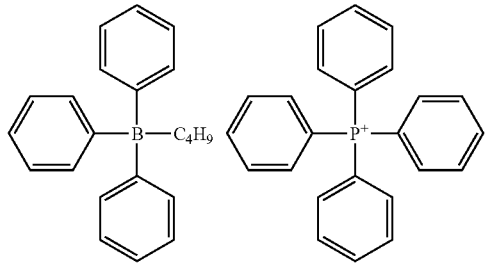

-continued
BS-11
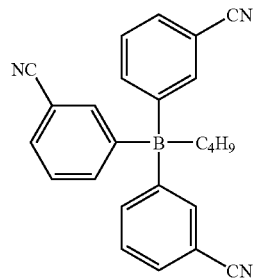 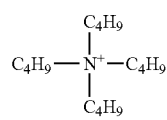
BS-12
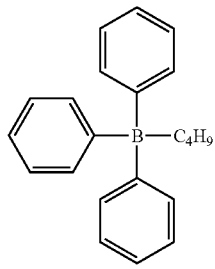
BS-13
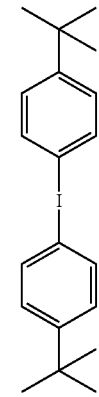
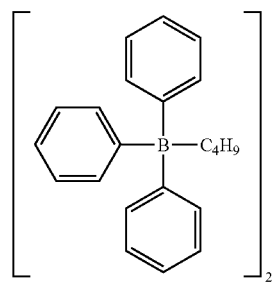 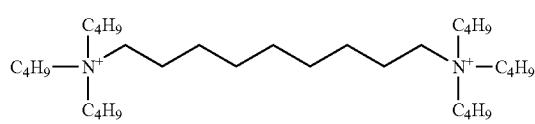
BS-14
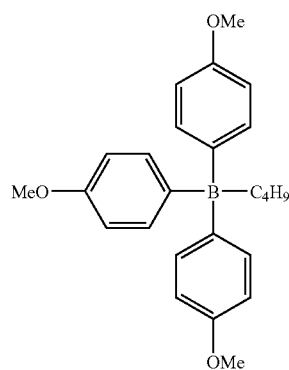 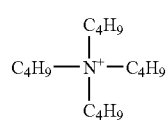
BS-15
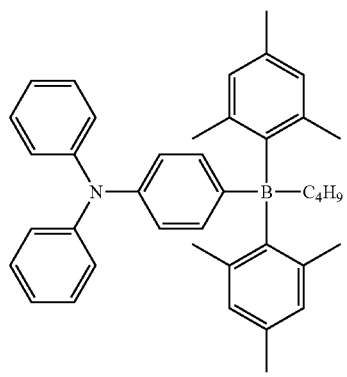
BS-16
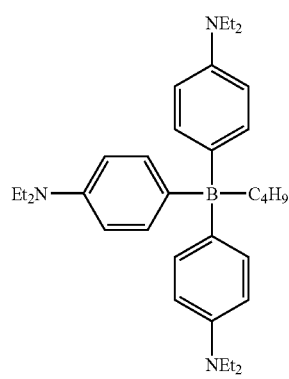 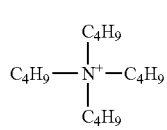
BS-17
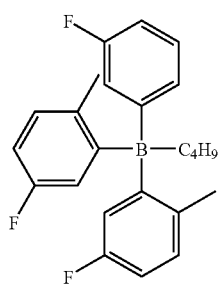 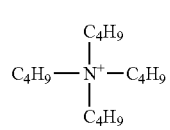

Various additives can be used together with the photoinitiator system to affect the polymerization rate. For example, a reducing agent such as an oxygen scavenger or a chain-transfer aid of an active hydrogen donor, or other compound can be used to accelerate the polymerization. An oxygen scavenger is also known as an autoxidizer and is capable of consuming oxygen in a free radical chain process. Examples of useful autoxidizers are N,N-dialkylanilines. Examples of preterred N,N-dialkylanilines are dialkylanilinies substituted in one or more of the ortho-, meta-, or para-position by the following groups: methyl, ethyl, isopropyl, t-butyl, 3,4-tetramethylene, phenyl, trifluoroinethyl, acetyl, ethoxycarbonyl, carboxy, carboxylate, trinethylsilymethyl, trimethylsilyl, triethylsilyl, trimethylgermanyl, triethylgermanyl, trimethylstannyl, triethylstannyl, n-butoxy, n-pentyloxy, phenoxy, hydroxy, acetyl-oxy, methylthio, ethylthio, isopropylthio, thio-(mercapto-), acctylthio, fluoro, chloro, bromo, and iodo. Representative examples of N,N-dialkylanilines useful in the present invention arc 4-cyano-N,N-dimethylaniline, 4-acetyl-N,N-dimethylaniline, 4-bromo-N,N-dimethylaniline, ethyl 4-(N,N-dimethylamino)benzoate, 3-chloro-N,N-dimethylaniline, 4-chloro-N,N-dimethylaniline, 3-ethoxy-N,N-dimethylaniline, 4-fluoro-N,N-dimethylaniline, 4-methyl-N,N-dimethylaniline, 4-ethoxy-N,N-dimethylaniline, N,N-dimethylaniline, N,N-dimetlylthioanicidine, 4-amino-N,N-dimethylaniline, 3-hydroxy-N,N-dimethylaniline, N,N,N',N'-tetrametyl-1,4-dianiline, 4-acetamido-N,N-dimethylaniline, 2,6-diisopropyl-N,N-dimethylaniline (DIDMA), 2,6-diethyl-N,N-dimethylaniline, N,N, 2,4,6-pentamethylaniline (PMA) and p-t-butyl-N,N-dimethylaniline. In accordance with another aspect of the invention, the dye borate photoinitiator is used in combination with a disultide coinitiator.

Examples of useful disulfides are described in U.S. Pat. No. 5,230,982 which is incorporated herein by reference. Two of the most preferred disulfides arc mercaptobenzothiazo-2-yl disulfide and 6-ethoxymercaptobenzothiazol-2-yl disultide. By using these distilfides as described in the referenced patent, the amount of the photoinitiators used in the microcapsules can be reduced to levels such that the background coloration or residual stain can be reduced significantly. At these low levels, the low-density image area coloration of the imaging layer does not detract unacceptably from the quality of the image. In addition, thiols, thioketones, trihalomethyl compounds, lophine dimer compounds, iodonium salts, sulfonium salts, azinium salts, organic peroxides, and azides are examples of compounds useful as polymerization accelerators.

Other additives which can be incorporated into the photopolymerization composition of the invention include various ultraviolet ray absorbers and hindered amine light stabilizers, photostabilizers as described in detail by J. F. Rabek in "Photostabilization of Polymers, Principles and Applications" published by Elsevier Applied Science in 1990.

The substantially colorless compound E, which reacts with the color-forming component A to develop a color, may or may not have a polymerizable group. For example, as described above, the substantially colorless compound E may be the same as the compound B having a polymerizable group or the same as the electron-accepting compound or the coupler compound listed as the compound C having no polymerizable group.

Preferably the above-mentioned substantially colorless component B, C, or E (developers), when added to the image forming unit of the present invention, is in a dispersion form prepared by technique such as sand mill in the presence of a water-soluble polymer, a sensitizer, and other color-forming aid. The dispersion can also be prepared by a process comprising the steps of dissolving these components in an organic solvent, blending the resulting solution with a polymer aqueous solution (i.e., aqueous phase) containing a surfactant and/or water soluble-polymer as protective colloids, and emulsifying the blend by such means as a homogenizer, and removing the organic solvent by evaporation so as to obtain a dispersion for use. Preferably the particle size of the dispersion is less than 5 µm, preferably less than 2 µm. Preferably the particle size is greater than 0.1 µm.

The imaging element of the invention comprises a support and above the support a light sensitive and heat developable image forming unit or light and pressure developable image forming unit. In one embodiment, a multicolor image can be realized using an imaging element produced by producing a plurality of single-color image forming layers within the image forming unit, each of which contains microcapsules enclosing a color-forming component A designed to form a different color, and irradiating the imaging element with a plurality of light sources each having a different wavelength. That is, the light sensitive and heat developable imaging layer or light sensitive and pressure developable imaging layer has a structure produced by providing on a support a first imaging layer which contains microcapsules containing a color-forming component for developing a yellow color and a photopolymerization composition sensitive to a light source having a central wavelength of $\lambda_1$, providing on top of the first imaging layer a second imaging layer which contains microcapsules containing a color-forming component for developing a magenta color and a photopolymerization composition sensitive to a light source having a central wavelength of $\lambda_2$, and providing on top of second imaging layer a third imaging layer which contains microcapsules containing a color-forming component for developing a cyan color and a photopolymerization composition sensitive to a light source having a central wavelength of $\lambda_3$. In addition, if necessary, the imaging layer may have an intermediate layer between the different colored imaging layers. The above-mentioned central wavelengths $\lambda_1$, $\lambda_2$, and $\lambda_3$ of the light sources differ from each other.

The light sensitive and heat developable image forming unit layer or light sensitive and pressure developable image forming unit of the present invention may have any number of the imaging layers. Preferably, the imaging layer may contain first to $i^{th}$ layers, each layer is sensitive to light having a central wavelength different from the light having a central wavelength to which other layers are sensitive, and each layer develops a color different from that of other layers. For example, the first imaging layer is sensitive to light having a central wavelength of $\lambda_1$ and develops a color, a second imaging layer is sensitive to light having a central wavelength of $\lambda_2$ and develops a color different from the color of the first imaging layer, and an $i^{th}$ imaging layer is sensitive to light having a central wavelength of $\lambda_i$ and develops a color different from the colors of i-1$^{th}$ imaging layer.

The multicolor image can also be realized using an imaging element by producing a multicolor image forming unit in which all of the microcapsules are in one layer. The layer contains microcapsules of which each type contains a color-forming component A of a different color, is sensitive to light having a central wavelength different from the light having a central wavelength to which other types of microcapsules are sensitive, and develops a color different from the color other types develop. For example, the first type of microcapsule is sensitive to light having a central wavelength of $\lambda_1$ and develops a color, a second type is sensitive to light having a central wavelength of $\lambda_2$ and develops a color different from the color of the first type of microcapsules, and an $i^{th}$ type of microcapsules is sensitive to light having a central wavelength of $\lambda_i$ and develops a color different from the colors of i-$1^{th}$ type of microcapsules. In the present invention. i is preferably any integer selected from 1 to 10, more preferably any integer selected from 2 to 6, and most preferably any integer selected from 2 to 4.

When images are formed using an imaging material having a multicolor image forming unit like the one for use in the present invention, the exposure step consists of image-wise exposure using plural light sources whose wavelengths match the absorption wavelengths of the imaging layers. respectively, and are different from each other. This exposure enables the imaging layers whose absorption wavelengths match the wavelengths of the respective light sources to form latent images selectively. Because of this, multicolor images can be formed with a high sensitivity and in high sharpness. Furthermore, since the background, which is colored with such compounds as a spectral sensitizing compound and a photopolymerization initiator, can be decolorized by irradiating the imaging layer surface with light, high-quality images having a high contrast can be formed.

The light sensitive and heat developable or light sensitive and pressure developable image forming unit or imaging layers of the invention also contain a binder material. There is no limitation on the choice of the binder material as far as it is compatible with other components incorporated in the layer or unit. The binder material includes, for example, water-soluble polymers, water dispersible polymers, and latex. Specific examples include proteins, protein derivatives, cellulose derivatives (e.g., cellulose esters), polysaccharides, casein, and the like, and synthetic water permeable colloids such as poly(vinyl lactams), acrylamide polymers, poly(vinyl alcohol) and its derivatives, hydrolyzed polyvinyl acetates, polymers of alkyl and sulfoalkyl acrylates and methacrylates, polyamides, polyvinyl pyridine acrylic acid polymers, maleic anhydride copolymers, polyalkylene oxide, methacrylamide copolymers, polyvinyl oxazolidinones, maleic acid copolymers, vinyl amine copolymers, methacrylic acid copolymers, acryloyloxyalkyl sulfonic acid copolymers, vinyl imidazole copolymers, vinyl sulfide copolymers, and homopolymer or copolymers containing styrene sulfonic acid. Binders also include dispersions made of solvent soluble polymers such as polystyrene, polyvinyl formal, polyvinyl butyral, acrylic resins, e.g., polymethyl acrylate, polybutyl acrylate, polymethyl methacrylate, polybutyl methacrylate, and copolymers thereof, phenol resins, styrene-butadiene resins, ethyl cellulose, epoxy resins, and urethane resins, and latices of such polymers.

The binder is preferably cross-linked so as to provide a high degree of cohesion and adhesion. Cross-linking agents or hardeners which may effectively be used in the coating compositions of the present invention include aldehydes, epoxy compounds, polyfunctional aziridines, vinyl sulfolies, methoxyalkyl melamines, triazines, polyisocyanates, dioxane derivatives such as dihydroxydioxane, carbodiimides, chrome alum, zirconiuin sulfate, and the like.

The light sensitive and heat developable or light sensitive and pressure developable image forming unit or imaging layer thereof may also contain various surfactants for such purposes as a coating aid, an antistatic agent, an agent to improve sliding properties, an emulsifier, and an adhesion inhibitor.

Examples of the surfactant that can be used include nonionic surfactants such as saponin, polyethylene oxide, and polyethylene oxide derivatives, e.g., alkyl ethers of polyethylene oxide; anionic surfactants such as alkylsulfonates, alkylbenzenesulfonates, alkylnaphthalenesulfonates, alkylsulfuric esters, N-acyl-N-alkyltaurines, sulfosuccinic esters, and sulfoalkylpolyoxyethylene alkylphenyl ethers; amphoteric surfactants such as alkylbetaines and alkylsulfobetaines; and cationic surfactants such as aliphatic or aromatic quaternary ammonium salts.

Furthermore, if necessary the light and heat sensitive or light sensitive and pressure developable image forming unit or an imaging layer thereof may contain additives other than those described above, for example, dyes, ultraviolet absorbing agents, plasticizers, fluorescent brighteners, matting agents, coating aids, hardeners, antistatic agents, and sliding property-improving agents. Typical examples of these additives are described in *Research Disclosure*, Vol. 176 (December 1978, Item 17643) and *Research Disclosure, Vol.* 187 (November 1979, Item 18716).

In the imaging element of the present invention, the imaging material uses color-forming component A which is encapsulated in microcapsules. For the encapsulation, a conventionally known method can be employed. Examples of the method include a method utilizing coacervation of a hydrophilic wall-forming material described in U.S. Pat. Nos. 2,800,457 and 2,800,458; an interfacial polymerization method described in U.S. Pat. No. 3,287,154; U.K. Patent 990,443; and JP-B Nos. 38-19574, 42-446, and 42-771: a method utilizing polymer deposition described in U.S. Pat. Nos. 3,418,250 and 3,660,304: a method utilizing an isocyanate-polyol wall-forming material described in U.S. Pat. No. 3,796,669: a method utilizing an isocyanate wall-forming material described in U.S. Pat. No. 3,914,511: a method utilizing urea-formaldehyde and urea-formaldehyde-resorcinol wall-forming materials described in U.S. Pat. Nos. 4,001,140; 4,087,376; and 4,089,802; a method utilizing w all-forming materials such as a melamine-formaldehyde resin and hydroxypropylcellulose described in U.S. Pat. No. 4,025,455; an in-situ method utilizing a polymerization of monomers described in JP-B No. 36-9168 and JP-A No. 51-9079; a method utilizing electrolytic dispersion cooling described in U.K. Patents 952,807 and 965,074; and a spray-drying method described in U.S. Pat. No. 3,111,407 and U.K. Patent 930,442.

The encapsulating method is not limited to the methods listed above. However, in the imaging material of the present invention, it is particularly preferable to employ an interfacial polymerization method comprising the steps of mixing an oil phase, prepared by dissolving or dispersing the color-forming component in a hydrophobic organic phase that becomes the core of the microcapsules, and an aqueous phase having a water-soluble polymer dissolved therein, emulsifying the mixture by means of a homogenizer or the like, and heating the emulsion so as to cause a polymer-forming reaction at the interface of droplets so that polymeric microcapsule walls are formed. This method makes it possible to form microcapsules having uniform particle diameters in a short period of time and to obtain an imaging material excellent in storability as a raw imaging material.

The reactants that form the polymer are added to the inside of the droplets and/or the outside of the droplets. Examples of the polymeric substance include polyurethane, polyurea, polyamide, polyester, polycarbonate, urea/formaldehyde resins, melamine resins, polystyrene, styrene/methacrylate copolymers, styrene/acrylate copolymers, and so on. Among these substances, polyurethane, polyurea, polyamide, polyester, and polycarbonate are preferable, and polyurethane and polyurea are particularly preferable. The above-listed polymeric substances may be used in combinations of two or more kinds.

The water-soluble polymer, which is present as protective colloids in the aqueous phase to be mixed with the oil phase, may be selected appropriately from conventionally known anionic polymers, nonionic polymers, and amphoteric polymers. Examples of the anionic polymer that can be used include natural ones and synthetic ones. Some examples are polymers having such groups as —COO—, —$SO_2$—, and the like. Specific examples thereof include naturally occurring substances such as gum arabic, alginic acid, and pectin; semisynthetic products such as carboxymethyl cellulose, gelatin derivatives, e.g., phthalated gelatin, sulfated starch, sulfated cellulose, and ligninsulfonic acid; and synthetic products such as maleic anhydride-based (including hydrolysate) copolymers, acrylic acid-based (including methacrylic acid-based) polymers and copolymers, vinylbenzenesulfonic acid-based polymers and copolymers, and carboxy-modified polyvinyl alcohol. Examples of the nonionic polymer include polyvinyl alcohol, hydroxyethyl cellulose, and methylcellulose. Examples of the amphoteric polymer include gelatin and the like. The water-soluble polymers are used as 0.01 to 10% by mass solutions.

A surfactant can also be incorporated in the aqueous phase. The surfactant can be suitably selected from anionic or nonionic surfactants that do not cause precipitation or flocculation by interacting with the protective colloids. Preferred examples of the surfactant include sodium alkylbenzenesulfonate, sodium alkylsulfate, sodium dioctylsulfosuccinate, and polyalkylene glycol (e.g., polyoxyethylene nonylphenyl ether).

When polyurethane is used as a microcapsule wall material, the microcapsule wall can be formed by mixing a polyvalent isocyanate and a second substance (e.g., polyol or polyamine) that reacts therewith to form the microcapsule wall in a water-soluble polymer aqueous solution (i.e., aqueous phase) or in an oily medium (oil phase) to be encapsulated, emulsifying the mixture, and heating the resulting emulsion so as to cause a polymer-forming reaction at the interface of droplets. As the polyvalent isocyanate and the polyol or polyamine, with which the polyvalent isocyanate reacts, those which are described in U.S. Pat. Nos. 3,281,383; 3,773,695; and 3,793,268; and JP-B Nos. 48-40347 and 49-24159. and JP-A Nos. 48-80191 and 48-84086 can be used.

When microcapsules containing the color-forming component are prepared, the color-forming component to be enclosed in the microcapsules may be present in a solution state or may be present in solid state inside the microcapsules at room temperature. If it is in the solution state, the color-forming component is mixed with an organic solvent having a high boiling point to form the microcapsule core. If it is in the solid states, the color former is dissolved in a thermal solvent or an auxiliary solvent. An auxiliary solvent is removed after encapsulation. The microcapsule core comprises mostly the color-forming component together with other additives. The thermal solvent is a solid at room temperature and becomes a liquid at elevated temperatures, for example, at curing temperatures during the encapsulation process. In this case, the microcapsule core comprises the color-forming component dispersed in a thermal solvent.

A thermal solvent in this invention is defined as compounds which is a solid at temperatures of less than 30° C., and become a liquid at temperatures of greater than 30° C., preferably greater than 40° C. Typical thermal solvents include 1,12-dihydroxydodecane, paraffin wax, bees wax, fatty acid, fatty acid amide, stearic acid, steramide, zinc stearate, and more preferably hindered phenols such as 2,6-di-t-butyl-4-methylphenol (BHT), thiodiethylene hydrocinnamate (IRGANOX™ 1035 from Ciba-Geigy Corp.) tetrakis methane (IRGANOXT™ 1010 from Ciba Geigy Corp.), bisphenol A diacetate (BPADA), diphenyl phtlialate, dicyclohexyl phthalate, diphenyl oxalate, benzyl oxynaphthalene, 1-hydroxy-2-naphtho ate,-rosin and m terphenyl derivatives, bis-dialkylaryl ethane such as 1,2-bis(3,4-dimethylphenyl)ethane, those disclosed in U.S. Pat. Nos. 4,885,271 and 4,885,271.

In a preferred embodiment of the invention, the color-forming component is mixed together with a photopolymerization composition to form the microcapsule core, or microcapsule internal phase. The microcapsule shell or the microcapsule wall material is a polyurea, or polyurethane-urea. In another preferred embodiment of the invention, the color-forming component is mixed together with a photolymerization composition to form the microcapsule core, or microcapsule internal phase. The microcapsule shell or the microcapsule wall material comprises a polyurea shell or a polyurethane-urea shell and a melamine-formaldehyde or urea-formaldehyde shell.

Preferably the microcapsule containing the color-forming component A is prepared by the steps of dissolving the color-forming component A in an auxiliary organic solvent such as ethyl acetate, or a thermal solvent, or the a photopolymerization composition to form a solution, adding to the solution a certain amount of a microcapsule wall material such as a polyfunctional isocynate to form the oil phase, adding the oil phase to an aqueous solution comprising a water soluble polymer such as polyvinyl alcohol or phthalated gelatin as the protective colloid, and optionally a surfactant, to form a mixture, emulsifying the mixture with a homogenizer to form an emulsion, optionally adding to the emulsion a polyfunctional amine as the curing agent, and curing the emulsion at elevated temperature to form the microcapsule.

If it is desirable to form a second shell, an aqueous solution of melamine and formaldehyde or a precondensate is added to the above emulsion. The melamine-formaldehyde shell is formed by raising the temperature of the resulting mixture at neutral or acidic pH, e.g., pH of 7 or less. The temperature of encapsulation is maintained at about 20 to 95° C., preferably about 30 to 85° C., and more preferably about 45 to 80° C.

The average particle diameter of the microcapsules for use in the imaging material of the present invention is preferably 20 μm or less, more preferably 10 μm or less and most preferably 6 μm or less from the standpoint of obtaining high resolution. The average particle diameter is preferably 0.1 μm or greater because, if the average particle diameter of the microcapsules is too small, the surface area per unit amount of the solid components becomes larger and a lager amount of wall-forming materials is required.

Examples of the support for use in the imaging material of the present invention include paper; coated paper; synthetic paper such as laminated paper; films such as polyethylene terephthalate film, cellulose triacetate film, polyethylene film, polystyrene film, and polycarbonate film; plates of metals such as aluminum, zinc, and copper; and these supports whose surface is treated with a surface treatment, a subbing layer or metal vapor deposition. A further example is the support described in *Research Disclosure*. Vol. 200 (December 1980, Item 20036 XVII). These supports may contain a fluorescent brightener, a bluing dye, a pigment, or other additives. Furthermore, the support itself may be made of an elastic sheet such as a polyurethane foam or rubber sheet. Between a support and the light sensitive and heat developable or the light sensitive and pressure developable image forming unit, a layer which comprises a polymer such as gelatin, polyvinyl alcohol (PVA), or the like having a low oxygen transmission rate can be provided. The presence of this layer makes it possible to effectively prevent the fading due to photooxidation of the images formed.

A particularly preferred support for a pressure developable element is a support comprising polyolefin or a copolymer thereof, wherein said substrate has a density of greater than 0.9 grams/cc and preferably greater than 1.0 grams/cc. In one embodiment of the pressure developable imaging element the support further comprises at least one unoriented layer, hereinafter called a flange layer, comprising polyolefin or a copolymer thereof. While the purpose of the layer is mainly to stiffen the support it may provide other functions also, such as caliper, optical properties, adhesion, and smoothness. In a preferred embodiment the support comprises two unoriented flange layers, and the polyolefin substrate is sandwiched between the two unoriented flange layers, forming a polyolefin substrate core.

The image element of the present invention can contain at least one electrically conductive layer, which can be either surface protective layer or a sub layer. The surface resistivity of at least one side of the support is preferably less than $1 \times 10^{12}$ Ω/square, more preferably less than $1 \times 10^{11}$ Ω/square at 25° C. and 20 percent relative humidity. To lower the surface resistivity, a preferred method is to incorporate at least one type of electrically conductive material in the electrically conductive layer. Such materials include both conductive metal oxides and conductive polymers or oligomeric compounds. Such materials have been described in detail in, for example, U.S. Pat. Nos. 4,203,769; 4,237,194; 4,272,616; 4,542,095; 4,582,781; 4,610,955; 4,916,011; and 5,340,676.

The image element of the invention can contain a curl control layer or a backing layer located opposite of the support to the imaging forming unit for the purposes of improving the machine-handling properties and curl of the recording element, controlling the friction and resistivity thereof, and the like. Typically, the backing may comprise a binder and a tiller and optionally a lubricant. Typical fillers include amorphous and crystalline silicas, poly(methyl methacrylate), hollow sphere polystyrene beads, micro-crystalline cellulose, zinc oxide, and talc. The filler loaded in the backing is generally less than 5 percent by weight of the binder component and the average particle size of the filler material is in the range of 1 to 30 µm. Examples of typical binders used in the backing are polymers such as polyacrylates, gelatin, polymethacrylates, polystyrenes, polyacrylamides, vinyl chloride-vinyl acetate copolymers, poly(vinyl alcohol), gelatin, and cellulose derivatives. Lubricants can be the same as those incorporated in the outer protective layer located in the opposite side to the backing layer. Additionally, an antistatic agent also can be included in the backing to prevent static hindrance of the image element. Particularly suitable antistatic agents are compounds such as dodecylbenzenesulfonate sodium salt, octylsulfonate potassium salt, oligostyrenesulfonate sodium salt and laurylsulfosuccinate sodium salt, and the like. The antistatic agent may be added to the binder composition in an amount of 0.1 to 15 percent by weight, based on the weight of the binder. An image forming unit may also be coated on the backside, if desired.

Visible images can be made by heat development if the imaging element of the present invention is a light sensitive and heat-developable imaging element or by pressure development if the imaging element of the present invention is a light sensitive and pressure developable imaging material. The heat or pressure development can be carried out either simultaneously with the exposure for latent image formation or after the exposure.

A conventionally known heating method can be employed for the heat development. Generally, the heating temperature is preferably 80 to 200° C., more preferably 83 to 160° C. and most preferably 85 to 130° C. The duration of heating is preferably in the range of 3 seconds to 1 minute, more preferably in the range of 4 to 45 seconds, and most preferably in the range of 5 to 30 seconds.

The pressure development can be accomplished with a pressure applicator device. For example, the imaging material is developed by passing an exposed imaging media between a pair of calendar rollers that rupture the microcapsules, thereby allowing contact between the color-forming component and a developer that react to develop the image. The imaging material can also be developed by moving a point contact which is resiliently biased into engagement with the imaging sheet. Typically, the imaging sheet is secured to a cylinder, and the point contact is positioned in resilient pressure contact with the imaging sheet. As the cylinder is rotated, the point contact is simultaneously moved along the cylinder in synchronism with the rotation of the cylinder to rupture the microcapsules and develop the image in the imaging sheet, or the imaging sheet may be mounted on a planer platform and the point contact is moved across the surface of the sheet using a screw thread in an X-Y transport device. The pressure that is to be applied is preferably 10 to 300 kg/cm$^2$, more preferably 80 to 250 kg/cm$^2$, and most preferably 130 to 200 kg/cm$^2$. If the pressure is less than 10 kg/cm$^2$, sufficient density of developed color may not be obtained, whereas if the pressure exceeds 300 kg/cm$^2$, the discrimination of the images may not be sufficient because even the hardened microcapsules are broken.

The imaging element of the present invention comprises a photopolymerization initiator or the like such as a spectral sensitizing. Therefore, the imaging element of the present invention is colored with the photopolymerization initiator or the like. Since background is also colored with the compound, it is very important for the method of the present invention that the colored background is decolorized by irradiation after heat development.

Accordingly, it is preferable that after the heat development, the image forming unit surface is irradiated with light to fix the images formed and to decolorize, decompose, or deactivate the components such as a spectral sensitizing compound which remains in the imaging layer and decreases the whiteness of the background. By carrying out the irradiation, it is possible to inhibit the coloration reaction. As a result, the density variation in the images can be inhibited, and the image storability can be largely enhanced.

The imaging element of the invention is exposed imagewise to light according to the pattern of a desired image shape so that the photopolymerization forms a latent image. The color development step is accomplished by heat or/and pressure so that the color-forming components develop colors according to the latent image to thereby produce images. The fixing step in which the imaging layer surface is irradiated with light so as to fix the image formed and decolorize the organic dyes.

In the exposure step, it is possible to employ, for example, a means for exposing the whole face to an amount of light which has wavelengths corresponding to the sensitive regions of respective colors and can provide a desired density of the developed color. The light source for use in the exposure step may be any light source selected from the light sources having wavelengths ranging from ultraviolet to infrared light if the light sensitive and heat developable imaging layer contains a light-absorbing material such as a spectral sensitizing compound that exhibits an absorption in a specific wavelength region. More specifically, a light source providing maximum absorption wavelengths ranging from 300 to 1000 nm is preferable. It is preferable to select and use a light source whose wavelength matches the absorption wavelength of the light-absorbing material such as an organic dye to be used. The selective use of such light-absorbing material enables the use of a blue to red light source and the use of a small-sized, inexpensive infrared laser device and consequently not only broadens the use of the imaging material of the present invention, but also raises sensitivity and image sharpness. Among the light sources, it is particularly preferable to use a laser light source such as a blue, green, or red laser light source or an LED from the viewpoint of simplicity, downsizing, and low cost of the device.

According to the image imaging process of the present invention, after the color development step, the image forming unit surface is subjected to a fixing step in which the whole imaging layer surface is irradiated with light from a specific light source to fix the images formed and to decolorize photopolymerization initiator components remaining in the imaging layer. As for the light source that can be used in the fixing step, a wide range of light sources, such as a mercury lamp, an ultrahigh pressure mercury lamp, an electrodeless discharge-type mercury lamp, a xenon lamp, a tungsten lamp, a metal halide lamp, and a fluorescent lamp can be suitably used. The method of irradiating the image forming unit with light from the light source in the fixing step is not particularly limited. The whole image forming unit surface may be irradiated with light at one time, or the image forming unit surface may be gradually irradiated with light by scanning or the like until the irradiation of the surface finally ends. That is, any method that finally enables the irradiation of the entire surface of the image forming unit material after image formation with nearly uniform light may be employed. The irradiation of the entire image forming unit layer is preferable from the standpoint of the enhancement of the effects of the present invention.

The duration of the irradiation with light from the light source needs to be the time period that allows the produced images to be fixed and the background to be sufficiently decolorized. In order to perform sufficient fixing of images and decolorization, the duration of the irradiation is preferably in the range of several seconds to tens of minutes and more preferably in the range of several seconds to several minutes.

Examples of the present invention will be explained below. However, it should be noted that the present invention is not limited to these examples.

EXAMPLES

Example 1

Preparation of Multilayer Element 1

A water-absorbing layer P consisting of gelatin, LP-1 and hardener bis(vinylsulfonyl methane) at the weight ratio of 100:100:3 was coated by slide hopper onto a moving white opaque support (8 mil Granwell Polylith GC2 oriented polypropylene synthetic paper having polyolefin resin coated layers on both sides) that had been previously corona discharge treated. The web was passed through a chilled section of 4°–6° C. to immobilize the coating solution, followed by a series of drying sections to remove the excess water. The thickness of the resulting dry layer is approximately 16 μm.

Coating solutions for the multilayer coating process of this invention to produce Element 1 were prepared by mixing all the components described below in water. The gelatin used in layer 2 and layer 3 is acid processed ossein from Croda. Coating solutions for Layer 2 and Layer 3 were prepared at 50° C. Preparation of the coating solution for the light and pressure sensitive Layer 1 has previously been described in detail in US 2002/0045121 A1, and it was prepared at room temperature.

Element 1

| | Component | Laydown (g/m$^2$) |
|---|---|---|
| Layer 3 | Gelatin | 1.08 |
| | Polydimethylsiloxane | 0.04 |
| | SF-1 | 0.02 |
| | SF-2 | 0.01 |
| | Triton X-200 ™ | 0.02 |
| | Ludox AM ™ | 0.27 |
| | Wet Laydown | 8.07 |
| Layer 2 | Gelatin | 3.23 |
| | LP-1 | 3.23 |
| | UV-1/UV-2 (@ 15/85 wt ratio) | 0.43 |
| | SF-1 | 0.01 |
| | Wet Laydown | 39.83 |
| Layer 1 | Cyan Caps | 2.51 |
| | Magenta Caps | 2.51 |
| | Yellow Caps | 2.51 |
| | Styrenic zinc salicylate developer | 12.92 |
| | Airflex 465 ™ | 1.55 |
| | Wet Laydown | 73.41 |

Structures of components used in Element 1:

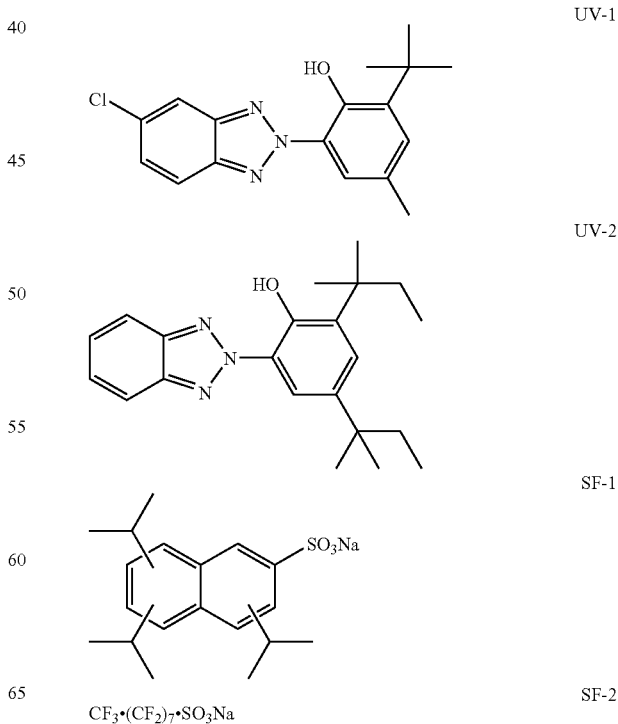

-continued

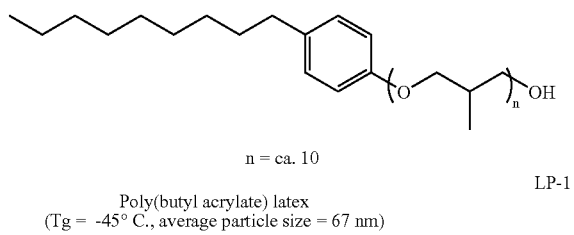

SF-3 n = ca. 10

LP-1

Poly(butyl acrylate) latex
(Tg = -45° C., average particle size = 67 nm)

On top of the synthetic support that was pre-coated with water-absorbing layer P as described previously, coating solutions for Layer 1, Layer 2, and Layer 3 were coated simultaneously by a multi-slot slide hopper, with Layer 1 being at the bottom and Layer 3 on the top. After coating, the resulting multilayer structure was chill-set at 4°–6° C. and dried gradually in conditions that varied from 13° C. to 30° C. so that the coating solutions stayed immobilized.

Example 2

Preparation of Elements 2 to 4

Elements 2 to 4 were prepared similarly to Element 1, except that the composition and wetload of Layer 2 were different, as listed below.

|  | Component | Laydown (g/m²) |
|---|---|---|
| Layer 2 of Element 2 | APO Gelatin | 3.23 |
|  | UV-1/UV-2 (@ 15/85 wt ratio) | 0.43 |
|  | LP-2 | 3.23 |
|  | SF-1 | 0.01 |
|  | Wet Laydown | 30.14 |
| Layer 2 of Element 3 | APO Gelatin | 4.84 |
|  | UV-1/UV-2 (@ 15/85 wt ratio) | 0.43 |
|  | LP-2 | 1.61 |
|  | SF-1 | 0.01 |
|  | Wet Laydown | 30.14 |
| Layer 2 of Element 4 | APO Gelatin | 2.15 |
|  | UV-1/UV-2 (@ 15/85 wt ratio) | 0.43 |
|  | LP-2 | 2.15 |
|  | SF-1 | 0.01 |
|  | Wet Laydown | 21.53 |

LP-2 is an acrylic emulsion polymer Aroset 3240™, available from Ashland Specialty Chemical Company (Columbus, Ohio), having a glass transition temperature of ~–35° C., and an average particle size of 345 nm.

| Element | Layer 1 Wet Laydown (g/m²) | Layers 2 & 3 Wet Laydown (g/m²) | Wet laydown of chill settable layer(s) based on non-chill settable layer |
|---|---|---|---|
| 1 | 73.41 | 47.90 | 65% |
| 2 | 73.41 | 38.21 | 52% |
| 3 | 73.41 | 38.21 | 52% |
| 4 | 73.41 | 29.60 | 40% |

Element 5 was prepared similarly to Element 1, except that chill settable protective Layers 2 and 3 were omitted, and only non-chill settable Layer 1 was coated.

Element 6 was prepared similarly to Element 1, except that it was coated on a support that was not water-absorbing. The resulting coating was full of uniformity defects. The defects were formed on drying due to the difficulty of immobilizing the multiple layers.

Example 3

Rheology of Coating Solutions for Layers 1, 2 & 3

Coating solutions for Layer 1, Layer 2, and Layer 3 used to prepare Element 3 were measured for their chill setting property. A controlled-strain rheometer, Rheometrics ARES Fluids Spectrometer, was used with couette geometry. The geometry has a cup diameter of 34 mm, and a bob diameter and length of 32.4 mm and 33 mm respectively. A sample volume of 12 mL was used. The dynamic viscosity at a frequency of 1 rad.s$^{-1}$ was recorded and the temperature was ramped at 1 c/minute from 45° C. to 5° C. A plot of the log of dynamic viscosity versus linear temperature was generated. The chill setting (gelation) temperature was defined as the temperature that the rate of viscosity change is the highest, i.e., the temperature where the slop is the highest on the log of dynamic viscosity versus linear temperature plot.

The coating solution for Layer 2 has a chill set temperature of 29° C. and the coating solution for Layer 3 has a chill set temperature of 28° C. The coating solution for Layer 1 did not exhibit any chill set behavior; the dynamic viscosity stayed nominally unchanged throughout the enter temperature ramp of 45° C. to 5° C.

Variations of solutions used for Layer 2 in Elements 1, 2, and 4 are expected to have very similar chill set temperature to that of Layer 2 in Element 3.

Example 4

Image Formation Process

All elements were exposed at 35° C. by use of light emitting diodes having a wavelength of 450 nm, 530 nm, and 620 nm. The irradiation energy was varied stepwise so that a step-wedge image was formed. Respective color images (red, green blue, neutral, etc.) were formed by proper combinations of the energy and wavelength of light for exposure.

The recording element having a latent image after the exposure as described above was developed by using a ball processor at a pressure of about 6000 psi, followed by heating for 10 second on a hot plate at 90° C. Finally, the element was irradiated with light for about 10 seconds using a 38 Klux fluorescent lamp. Red, green and blue optical densities in the maximum exposure area (Dmin) and minimum exposure area (Dmin) were read using an X-Rite densitometer. Gloss in minimum exposure area (black) was measured by Gardner micro-tri-gloss meter at 20-degree angle. The results are tabulated below in Table 1 and Table 2 for a neutral step scale.

TABLE 1

|  | Dmax Densities | | | Dmin Densities | | |
|---|---|---|---|---|---|---|
| Example | R/N | G/N | B/N | R/N | G/N | B/N |
| 1 | 1.66 | 1.66 | 1.69 | 0.10 | 0.12 | 0.13 |
| 2 | 1.66 | 1.65 | 1.73 | 0.09 | 0.10 | 0.15 |
| 3 | 1.68 | 1.67 | 1.76 | 0.09 | 0.10 | 0.15 |
| 4 | 1.76 | 1.73 | 1.81 | 0.09 | 0.10 | 0.15 |
| 5 (comparison) | N.A. | N.A. | N.A. | N.A. | N.A. | N.A. |

N.A. = not available

It is noted that Element 5, which did not have protective overcoats (Layer 1 and Layer 2), not only had very low gloss, but was also scratched severely during image processing, thus is not acceptable for customer handling.

TABLE 2

| Element | Gelatin in Layer 2 (g/m²) | Latex in Layer 2 (g/m²) | % latex in Layer 2 | Gloss |
|---|---|---|---|---|
| 1 | 3.23 | 3.23 (LP-1) | 50% | 71.65 |
| 2 | 3.23 | 3.23 (LP-2) | 50% | 63.30 |
| 3 | 4.84 | 1.61 (LP-2) | 25% | 33.30 |
| 4 | 2.15 | 2.15 (LP-2) | 50% | 40.50 |

As is seen in the above tables, as the thickness and the level of latex 2 increases in layer 2. gloss is dramatically improved.

Example 5

Non-Chill Settable Layer Coated Between Chill Settable Layers

Experimentation was performed to investigate the feasibility of coating a non setting layer between 2 chill settable layers simultaneously. Onto a moving white opaque support (8 mil Granwell Polylith GC2 oriented polypropylene synthetic paper having polyolefin resin coated layers on both sides) that had been previously corona discharge treated, the following layers were coated simultaneously using a slide hopper: a bottom chill-settable gelatin solution layer at a dry coverage of about 2.6 g/m², a non settable layer comprising poly(vinyl alcohol) and a poly(methyl acrylate) latex at a ratio of 0.6:1 above the bottom gelatin layer at a dry coverage of about 20 g/m², a chill settable layer comprising gelatin and a poly(methyl acrylate) latex above the non settable layer at a dry coverage of about 6 g/m², and a chill settable gelatin layer above the gelatin/latex layer at a dry coverage of about 1 g/m². After coating, the layers were set and dried in a similar manner as described in Example 1. The coated layers demonstrated excellent coating quality.

The invention has been described in detail with particular reference to certain preferred embodiments thereof, but it will be understood that variations and modifications can be effected within the spirit and scope of the invention.

What is claimed is:

1. An imaging element comprising in order
   a support;
   a light sensitive image forming unit comprising microcapsules and a developer;
   an inner protective overcoat layer; and
   an outer protective overcoat layer, wherein the outer protective overcoat layer has a modulus ratio to the inner protective layer of greater than 1.2.

2. The imaging element of claim 1 wherein the imaging element is light sensitive and pressure developable.

3. The imaging element of claim 1 wherein the inner protective overcoat layer has a modulus of less than 3 Gpa.

4. The imaging element of claim 1 wherein the inner protective overcoat layer comprises a hydrophilic colloid.

5. The imaging element of claim 4 wherein the inner protective overcoat layer further comprises a cross-linker.

6. The imaging element of claim 4 wherein the inner protective overcoat layer further comprises a water dispersible resin.

7. The imaging element of claim 4 wherein the inner protective overcoat layer further comprises a UV absorbing material.

8. The imaging element of claim 1 wherein the outer protective overcoat layer has a modulus of greater than 3 Gpa.

9. The imaging element of claim 1 wherein the outer protective overcoat layer comprises a binder and a lubricant.

10. The imaging element of claim 9 wherein the outer protective overcoat layer further comprises a cross-linker.

11. The imaging element of claim 9 wherein the outer protective overcoat layer further comprises a stiff filler.

12. The imaging element of claim 1 further comprising at least one non-imaging layer comprising a hydrophilic colloid located between the support and the image forming unit.

13. The imaging element of claim 12 wherein the hydrophilic colloid of the non-imaging layer is gelatin.

14. The imaging element of claim 12 wherein the non-imaging layer further comprises a water dispersible resin.

15. The imaging element of claim 12 wherein the non-imaging layer further comprises a cross-linker.

16. The imaging element of claim 1 further comprising an antistatic layer.

17. The imaging element of claim 16 wherein the antistatic layer is on the opposite side of the support from the imaging unit.

* * * * *